(12) United States Patent
Sakurai et al.

(10) Patent No.: US 10,916,628 B2
(45) Date of Patent: Feb. 9, 2021

(54) SEMICONDUCTOR DEVICE

(71) Applicant: FUJI ELECTRIC CO., LTD., Kanagawa (JP)

(72) Inventors: Yosuke Sakurai, Azumino (JP); Yuichi Onozawa, Matsumoto (JP); Akio Nakagawa, Chigasaki (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/281,031

(22) Filed: Feb. 20, 2019

(65) Prior Publication Data
US 2019/0312105 A1 Oct. 10, 2019

(30) Foreign Application Priority Data

Apr. 4, 2018 (JP) ................... 2018-072792

(51) Int. Cl.
*H01L 29/06* (2006.01)
*H01L 27/06* (2006.01)
*H01L 29/739* (2006.01)
*H01L 29/08* (2006.01)
*H01L 29/861* (2006.01)
(Continued)

(52) U.S. Cl.
CPC ...... *H01L 29/0696* (2013.01); *H01L 27/0664* (2013.01); *H01L 29/063* (2013.01); *H01L 29/0638* (2013.01); *H01L 29/0834* (2013.01); *H01L 29/1095* (2013.01); *H01L 29/407* (2013.01); *H01L 29/7397* (2013.01); *H01L 29/8613* (2013.01)

(58) Field of Classification Search
None
See application file for complete search history.

(56) References Cited

U.S. PATENT DOCUMENTS

2008/0035992 A1* 2/2008 Kawaguchi ....... H01L 29/66734
257/331
2012/0007173 A1* 1/2012 Yamamoto .......... H01L 29/0634
257/330
(Continued)

OTHER PUBLICATIONS

Masahiro Tanaka, "Conductivity modulation in the channel inversion layer of very narrow mesa IGBT", The 29th International Symposium on Power Semiconductor Devices & IC's, Jul. 24, 2017, pp. 61-64, Sapporo.

*Primary Examiner* — Xiaoming Liu

(57) ABSTRACT

Provided is a semiconductor device including a drift region having a first conductivity type provided on a semiconductor substrate; a plurality of trench portions provided above the drift region, on a top surface side of the semiconductor substrate; a base region having a second conductivity type provided in a mesa portion sandwiched between the plurality of trench portions, in the semiconductor substrate; an emitter region having the first conductivity type provided above the base region, on a top surface of the mesa portion; and a contact region having the second conductivity type and a higher doping concentration than the base region, provided adjacent to the emitter region on the top surface of the mesa portion, wherein a mesa width of the mesa portion is less than or equal to 100 nm, and a bottom end of the contact region is shallower than a bottom end of the emitter region.

11 Claims, 21 Drawing Sheets

(51) Int. Cl.
*H01L 29/10* (2006.01)
*H01L 29/40* (2006.01)

(56) References Cited

U.S. PATENT DOCUMENTS

| | | | | |
|---|---|---|---|---|
| 2015/0295042 A1* | 10/2015 | Kameyama | ......... | H01L 27/0629 |
| | | | | 257/140 |
| 2017/0263740 A1* | 9/2017 | Onozawa | ............ | H01L 29/4236 |
| 2017/0352747 A1* | 12/2017 | Sumitomo | .......... | H01L 27/0727 |

\* cited by examiner

SEMICONDUCTOR DEVICE

The contents of the following Japanese patent application are incorporated herein by reference:
NO. 2018-072792 filed in JP on Apr. 4, 2018.

BACKGROUND

1. Technical Field

The present invention relates to a semiconductor device.

2. Related Art

Conventionally, a semiconductor device is known having a very narrow mesa portion that is less than or equal to 100 nm, as shown in Non-Patent Document 1, for example.
Non-Patent Document 1: Masahiro Tanaka and Akio Nakagawa, "Conductivity modulation in the channel inversion layer of very narrow mesa IGBT", Power Semiconductor Devices and IC's (ISPSD), 2017 29$^{th}$ International Symposium on, IEEE, 24 Jul. 2017

There is a desire for improvement of the IV characteristics of a semiconductor device.

SUMMARY

According to a first aspect of the present invention, provided is a semiconductor device comprising a drift region having a first conductivity type provided on a semiconductor substrate; a plurality of trench portions provided above the drift region, on a top surface side of the semiconductor substrate; a base region having a second conductivity type provided in a mesa portion sandwiched between the plurality of trench portions, in the semiconductor substrate; an emitter region having the first conductivity type provided above the base region, on a top surface of the mesa portion; and a contact region having the second conductivity type and a higher doping concentration than the base region, provided adjacent to the emitter region on the top surface of the mesa portion, wherein a mesa width of the mesa portion is less than or equal to 100 nm, and a bottom end of the contact region is shallower than a bottom end of the emitter region.

The plurality of trench portions may include gate conducting portions. The bottom end of the contact region may be deeper than top ends of the gate conducting portions.

The semiconductor device may comprise a plurality of the emitter regions arranged on the top surface of the mesa portion; and a carrier path layer having a second conductivity type and a higher doping concentration than the base region, extending in a depth direction of the semiconductor substrate from the top surface of the mesa portion between adjacent emitter regions.

The carrier path layer may have the same doping concentration as the contact region.

A depth of a bottom end of the carrier path layer may be greater than or equal to an interval between the carrier path layer and the emitter region at the top surface of the mesa portion.

The carrier path layer may be provided at a position including at least a center between adjacent emitter regions, at the top surface of the mesa portion.

The carrier path layer may occupy a region that is greater than or equal to 25% and less than or equal to 75% of a region between adjacent emitter regions, at the top surface of the mesa portion.

According to a second aspect of the present invention, provided is a semiconductor device comprising a drift region having a first conductivity type provided on a semiconductor substrate; a plurality of trench portions provided above the drift region, on a top surface side of the semiconductor substrate; a base region having a second conductivity type provided in a mesa portion sandwiched between the plurality of trench portions, in the semiconductor substrate; a plurality of emitter regions having the first conductivity type arranged on a top surface of the mesa portion, on the top surface of the mesa portion; and a carrier path layer having a second conductivity type and a higher doping concentration than the base region, extending from the top surface of the mesa portion to the drift region between adjacent emitter regions among the plurality of emitter regions. A mesa width of the mesa portion may be less than or equal to 100 nm. The carrier path layer may occupy the entire region between adjacent emitter regions among the plurality of emitter regions, at the top surface of the mesa portion.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

In this Specification, a side in one direction parallel to a depth direction of a semiconductor substrate is referred to as the "top", while a side in the other direction is referred to as the "bottom". Among the two main surfaces of substrates, layers, and other members, one surface is referred to as the "top surface" and the other surface is referred to as the "bottom surface". The directions of "top", "bottom", "front", and "back" are not limited to the direction of gravity or to a direction in which the semiconductor device is attached to a substrate or the like during implementation.

In this Specification, there are cases where technical ideas are described using the orthogonal coordinate axes of an X axis, a Y axis, and a Z axis. In this Specification, the plane parallel to a top surface of the semiconductor substrate is an XY plane, and the depth direction of the semiconductor substrate is the Z axis. In this Specification, a view of the semiconductor substrate in the Z-axis direction is referred to as a planar view.

In each embodiment example, an example is shown in which a first conductivity type is N type and a second conductivity type is P type, but instead, the first conductivity type may be P type and the second conductivity type may be N type. In this case, the conductivity types of the substrate, layers, regions, and the like in each embodiment example may each be the opposite polarity.

In this Specification, the doping concentration refers to the concentration of impurities made to be donors or acceptors. In this Specification, there are cases where the concentration difference between the donors and the acceptors is referred to as the doping concentration. Furthermore, there are cases where the peak value of a doping concentration distribution in a doping region is referred to as the doping concentration in this doping region.

In this Specification, having "N" or "P" written in front of a layer or region means that electrons or holes are respectively the majority carrier. Furthermore, "+" and "−" appended to "N" and "P" respectively mean a higher doping concentration and a lower doping concentration than in layers or regions for which "+" and "−" are not appended. Yet further, "++" and "−−" appended to "N" and "P" respectively mean a higher doping concentration and a lower doping concentration than in layers or regions for which "+" and "−" are appended to "N" or "P".

Figure 1A:
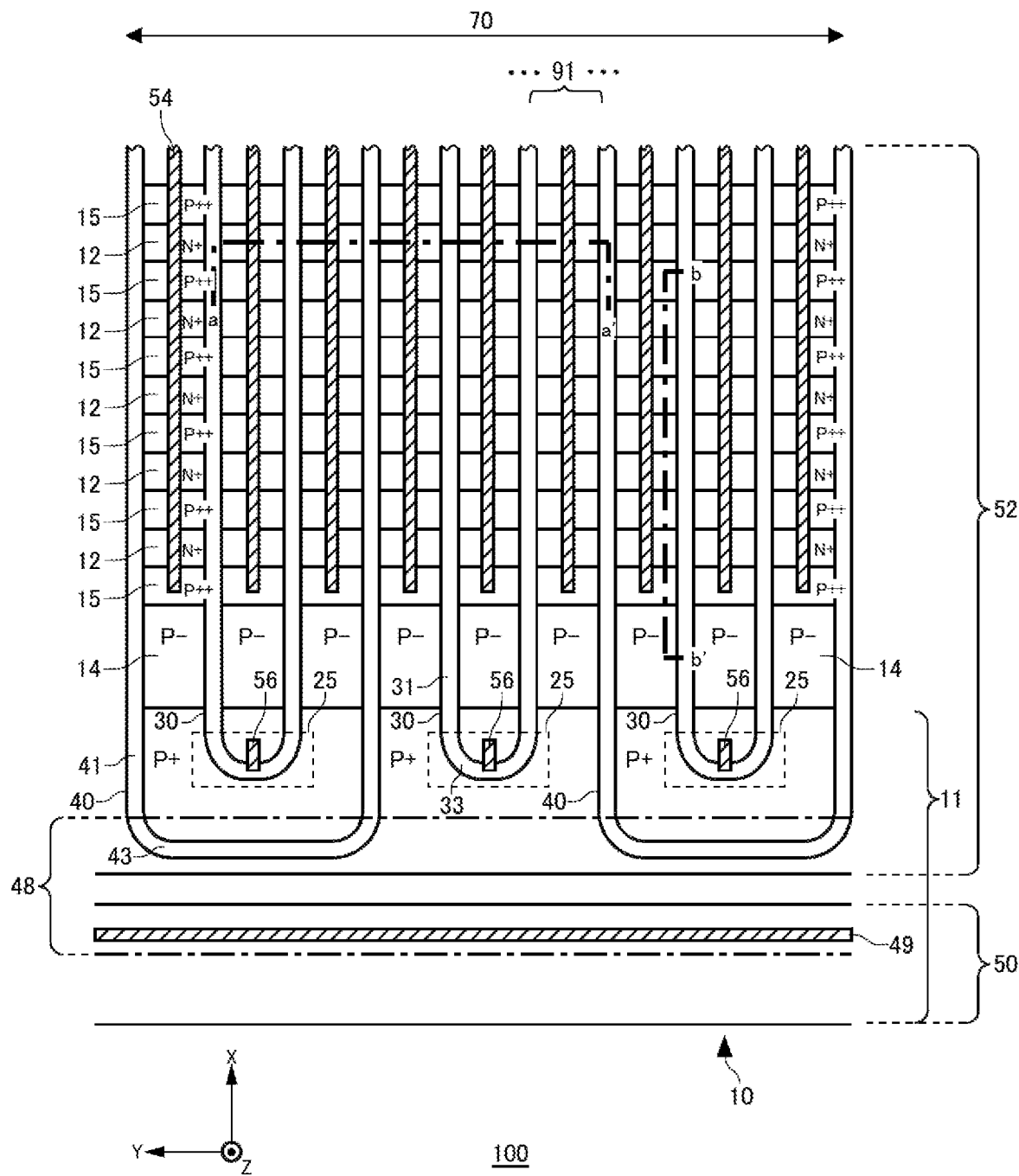
FIG. 1A shows an exemplary top surface view of a semiconductor device 100 according to a first embodiment example.

FIG. 1A shows an exemplary top surface view of a semiconductor device 100 according to a first embodiment example. The semiconductor device 100 of this example is an IGBT (Insulated Gate Bipolar Transistor) including a transistor portion 70.

The transistor portion 70 is a region including emitter regions 12 and gate trench portions 40. The transistor portion 70 of this example is a region where a collector region provided on a bottom surface side of the semiconductor substrate 10 is projected onto the top surface of the semiconductor substrate 10, but is not limited to this. The collector region has a second conductivity type. The collector region of this example is P+ type, for example.

In FIG. 1A, a region around a chip end portion, which is the edge side of the semiconductor device 100, is shown, and other regions are omitted. In this example, for the sake of convenience, an edge portion on the negative side in the X-axis direction is described, but this description is similar for the other edge of the semiconductor device 100. The semiconductor device 100 may be an RC-IGBT that includes a diode such as an FWD (Free Wheel Diode).

The semiconductor substrate 10 may be a silicon substrate, may be a silicon carbide substrate, or may be a nitride semiconductor substrate such as a gallium nitride semiconductor substrate or the like. The semiconductor substrate 10 of the present example is a silicon substrate.

The semiconductor device 100 of this example includes gate trench portions 40, dummy trench portions 30, a well region 11, emitter regions 12, a base region 14, and contact regions 15 on the top surface of the semiconductor substrate 10. Furthermore, the semiconductor device 100 of this example includes an emitter electrode 52 and a gate metal layer 50 provided above the top surface of the semiconductor substrate 10.

The emitter electrode 52 and the gate metal layer 50 are formed by a material including metal. For example, at least a partial region of the emitter electrode 52 may be formed by aluminum or an aluminum-silicon alloy. At least a partial region of the gate metal layer 50 may be formed of aluminum or an aluminum-silicon alloy. The emitter electrode 52 and the gate metal layer 50 may include a barrier metal formed by titanium, a titanium compound, or the like on a bottom layer of a region formed by aluminum or the like. The emitter electrode 52 and the gate metal layer 50 are provided separated from each other.

The emitter electrode 52 is provided above the gate trench portions 40, the dummy trench portions 30, the well region 11, the emitter regions 12, the base region 14, and the contact regions 15. The gate metal layer 50 is provided above the well region 11.

The emitter electrode 52 and the gate metal layer 50 are provided above the semiconductor substrate 10, sandwiching an interlayer dielectric film. The interlayer dielectric film is omitted from FIG. 1A. A contact hole 49, contact holes 54, and contact holes 56 are provided penetrating through the interlayer dielectric film.

The contact hole 49 connects the gate metal layer 50 and the gate runner 48. A plug formed by tungsten or the like may be formed within the contact hole 49.

The gate runner 48 electrically connects the gate metal layer 50 and the gate trench portions 40. The gate runner 48 is not connected to a dummy conducting portion within the dummy trench portion 30. For example, the gate runner 48 is formed by polysilicon or the like doped with impurities.

The gate runner 48 of this example is provided from below the contact hole 49 to edge portions of the gate trench portions 40. An interlayer dielectric film such as an oxidized film is provided between the gate runner 48 and the top surface of the semiconductor substrate 10. At the edge portions of the gate trench portions 40, the gate conducting portions are exposed in the top surface of the semiconductor substrate 10. The gate trench portions 40 contact the gate runner 48 at this exposed portion of the gate conducting portion.

The contact holes 56 connect the emitter electrode 52 and the dummy conducting portions within the dummy trench portions 30. A plug formed by tungsten or the like may be provided within the contact holes 56.

The connecting sections 25 are provided between the emitter electrode 52 and the dummy conducting portion. The connecting sections 25 are made of a conductive material, such as polysilicon doped with impurities. The connecting sections 25 are provided above the top surface of the semiconductor substrate 10, with an interlayer dielectric film or the like made of an oxidized film or the like interposed therebetween.

The gate trench portions 40 are arranged at predetermined intervals along a predetermined arrangement direction (the Y-axis direction in this example). Each gate trench portion 40 of this example may include two extending portions 41 extending along an extension direction (the X-axis direction in this example) perpendicular to the arrangement direction and parallel to the top surface of the semiconductor substrate 10, and a connecting portion 43 that connects the two extending portions 41. The gate trench portion 40 of this example is electrically connected to the gate metal layer 50. Furthermore, the gate trench portion 40 contacts the emitter region 12.

The connecting portion 43 is preferably provided having a portion thereof shaped as a curve. By contacting the end portions of the two extending portions 41 of the gate trench portion 40, it is possible to relax the electric field concentration at the end portions of the extending portions 41. The gate runner 48 is connected to the gate conducting portion at the connecting portion 43 of the gate trench portion 40.

The dummy trench portions 30 are arranged at predetermined intervals along a predetermined arrangement direction (the Y-axis direction in this example), in a similar manner as the gate trench portions 40. Each dummy trench portion 30 of this example is U-shaped on the top surface of the semiconductor substrate 10, in a similar manner as the gate trench portions 40. In other words, each dummy trench portion 30 may include two extending portions 31 extending along the extension direction, and a connecting portion 33 that connects the two extending portions 31. The dummy trench portion 30 is electrically connected to the emitter electrode 52.

The well region 11 is a region having the second conductivity type provided closer to the top surface side of the semiconductor substrate 10 than a drift region 18, which is described further below. The well region 11 is P+ type, for example. The well region 11 is provided in a predetermined range from an end portion of an active region on the side where the gate metal layer 50 is provided. The diffusion depth of the well region 11 may be greater than the depths of the gate trench portions 40 and dummy trench portions 30. Regions of the gate trench portions 40 and dummy trench portions 30 on the gate metal layer 50 side are provided in the well region 11. The bottom ends of the gate trench portions 40 and dummy trench portions 30 in the extension direction are covered by the well region 11.

The contact holes 54 are provided above each region of the emitter regions 12 and contact regions 15 in the transistor portion 70. In this way, one or more contact holes 54 are provided on the interlayer dielectric film. The one or more contact holes 54 may be provided extending in the extension direction.

A mesa portion 91 is a region provided adjacent to each trench portion in the Y-axis direction, in a plane parallel to the top surface of the semiconductor substrate 10. Each mesa portion is a portion of the semiconductor substrate 10 sandwiched between two adjacent trench portions, and may be a portion with a depth reaching the deepest floor portion of each trench from the top surface of the semiconductor substrate 10. The extending portion of each trench portion may be treated as one trench portion. In other words, the region sandwiched between two extending portions may be treated as the mesa portion.

Each mesa portion 91 of this example is provided adjacent to at least one gate trench portion 40 and dummy trench portion 30 in the transistor portion 70. The mesa portion 91 includes the well region 11, the emitter regions 12, the base region 14, and the contact regions 15 on the top surface of the semiconductor substrate 10. In the mesa portion 91, the emitter regions 12 and the contact regions 15 are provided in an alternating manner in the extension direction.

The base region 14 is a region having the second conductivity type provided on the top surface side of the semiconductor substrate 10. As an example, the base region 14 is P− type. For example, the doping concentration of the base region 14 is greater than or equal to $2 \times 10^{17}$ cm$^{-3}$ and less than or equal to $8 \times 10^{17}$ cm$^{-3}$. The doping concentration of the base region 14 of this example is $6 \times 10^{17}$ cm$^{-3}$. The base region 14 may be provided at both end portions of the mesa portion 91 in the X-axis direction, on the top surface of the semiconductor substrate 10. It should be noted that FIG. 1A shows only one end portion of this base region 14 in the X-axis direction.

The emitter regions 12 are provided on the top surfaces of the mesa portions 91, above the base region 14. In this example, a plurality of emitter regions 12 are arranged in the X-axis direction. The emitter regions 12 are provided in contact with the gate trench portions 40. The emitter regions 12 may be provided in the Y-axis direction from one end to the other end of two trench portions extending in the X-axis direction and sandwiching a mesa portion 91. The emitter regions 12 are provided below the contact holes 54 as well. The emitter regions 12 of this example have the first conductivity type. The emitter regions 12 are N+ type, for example.

The contact regions 15 are regions having the second conductivity type and a higher doping concentration than the base region 14. The contact regions 15 of this example are P++ type, for example. The contact regions 15 are provided on the top surfaces of the mesa portions 91. The contact regions 15 are provided in contact with the emitter regions 12. The contact regions 15 may be provided in the Y-axis direction from one to another of two trench portions extending in the X-axis direction and sandwiching a mesa portion 91. The contact regions 15 may contact the gate trench portions 40, but do not need to contact the gate trench portions 40. The contact regions 15 of this example contact the dummy trench portions 30 and the gate trench portions 40. The contact regions 15 are provided below the contact holes 54 as well.

Figure 1B:
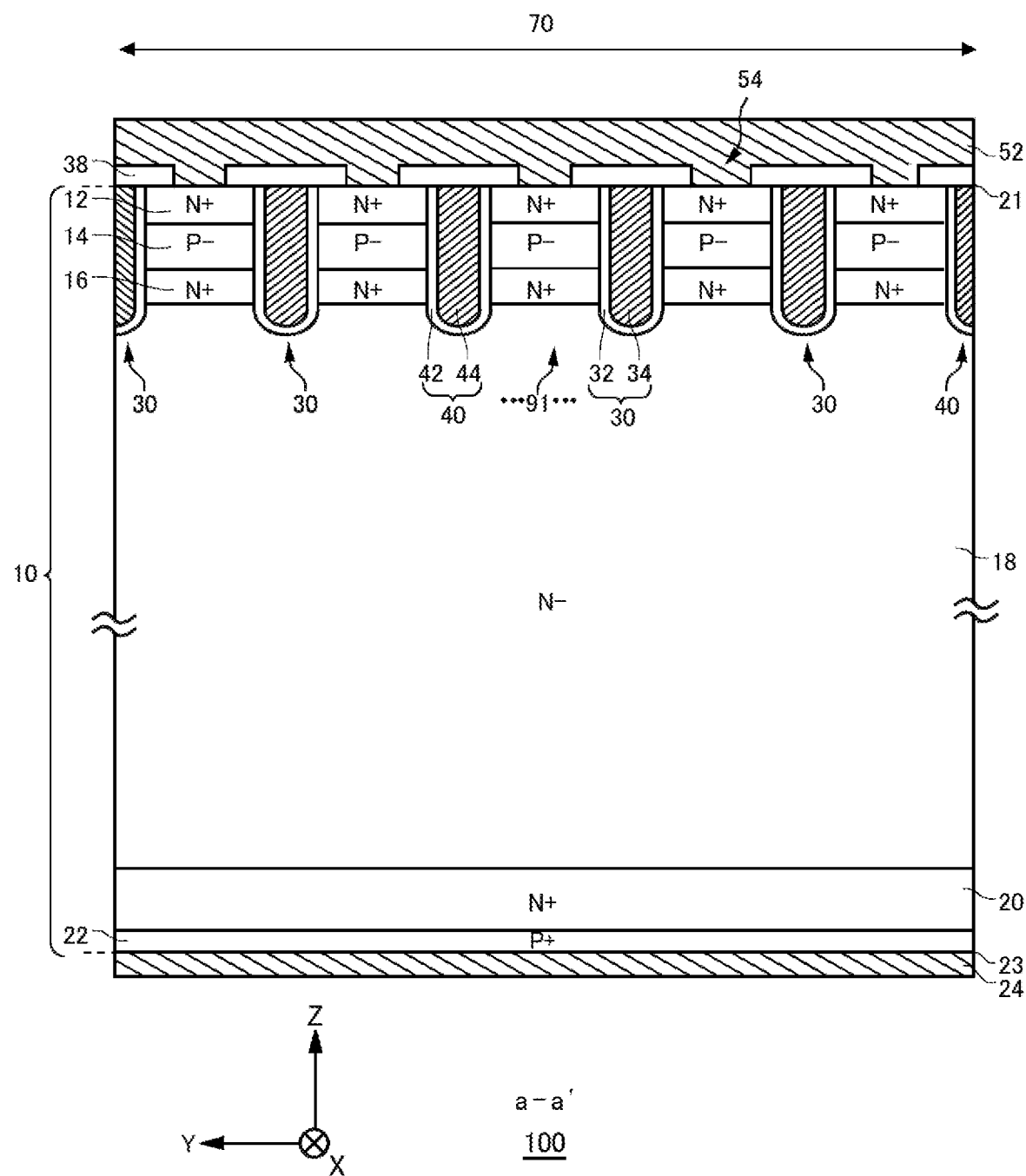
FIG. 1B shows an example of the a-a' cross section in FIG. 1A.

FIG. 1B shows an example of the a-a' cross section in FIG. 1A. The a-a' cross section is the YZ plane passing through the emitter regions 12, the base region 14, and the contact regions 15 in the transistor portion 70. The semiconductor device 100 of this example includes the semiconductor substrate 10, the interlayer dielectric film 38, the emitter electrode 52, and the collector electrode 24 in the a-a' cross section. The emitter electrode 52 is provided on the top surface 21 of the semiconductor substrate 10 and the top surface of the interlayer dielectric film 38.

The drift region 18 is a region having the first conductivity type provided in the semiconductor substrate 10. The drift region 18 of this example is N− type, for example. The drift region 18 may be a region that remains without being formed as another doping region in the semiconductor substrate 10. In other words, the doping concentration of the drift region 18 may be the doping concentration of the semiconductor substrate 10.

The buffer region 20 is a region having the first conductivity type provided below the drift region 18. The buffer region 20 of this example is N+ type, for example. The doping concentration of the buffer region 20 is higher than the doping concertation of the drift region 18. The buffer region 20 may function as a field stop layer, which prevents the depletion layer expanding from the bottom surface side of the base region 14 from reaching the collector region 22 having the second conductivity type and a cathode region having the first conductivity type.

The collector region 22 is a region having the second conductivity type provided on the bottom surface side of the semiconductor substrate 10 in the transistor portion 70. The collector region 22 is P+ type, for example. The collector region 22 of this example is provided below the buffer region 20.

The collector electrode 24 is formed on the bottom surface 23 of the semiconductor substrate 10. The collector electrode 24 is formed by a conductive material such as metal.

The accumulation region 16 is a region having the first conductivity type provided above the drift region 18 in the mesa portion 91. The accumulation region 16 of this example is N+ type, for example. The accumulation region 16 of this example is provided in contact with the gate trench portion 40 and the dummy trench portion 30. The doping concentration of the accumulation region 16 is higher than the doping concentration of the drift region 18. By providing the accumulation region 16, it is possible to increase the carrier injection enhancement effect (IE effect) and reduce the ON voltage of the transistor portion 70.

The base region 14 is a region having the second conductivity type provided above the accumulation region 16, in the mesa portion 91. The base region 14 is provided in contact with the gate trench portion 40.

The emitter region 12 is provided between the base region 14 and the top surface 21 in the mesa portion 91. The emitter region 12 is provided in contact with the gate trench portion 40. The emitter region 12 may contact the dummy trench portion 30, but does not need to contact the dummy trench portion 30. The doping concentration of the emitter region 12 is higher than the doping concentration of the drift region 18. Arsenic (As) is one example of the dopant of the emitter region 12.

One or more gate trench portions 40 and one or more dummy trench portions 30 are provided on the top surface 21. Each trench portion is provided from the top surface 21 to the drift region 18. In a region where at least one of the emitter region 12, the base region 14, the contact region 15, and the accumulation region 16 is provided, each trench portion penetrates through these regions to reach the drift region 18. Having a trench portion penetrate through a doping region is not limited to manufacturing performed in the order of forming the doped region and then forming the trench portion. A case in which the doping region is formed between trench portions after the trench portions have been formed is also included in the meaning of having a trench portion penetrate through a doping region.

The gate trench portion 40 is provided above the drift region 18. The gate trench portion 40 includes a gate trench formed on the top surface 21 of the semiconductor substrate 10, a gate insulating film 42, and a gate conducting portion 44.

The gate insulating film 42 is formed covering an inner wall of the gate trench. The gate insulating film 42 may be formed by oxidizing or nitriding a semiconductor of the inner wall of the gate trench.

The gate conducting portion 44 is formed farther inward than the gate insulating film 42 within the gate trench. The gate insulating film 42 provides insulation between the gate conducting portion 44 and the semiconductor substrate 10. The gate conducting portion 44 is formed by a conductive material such as polysilicon. The gate trench portion 40 is covered by the interlayer dielectric film 38 on the top surface 21.

The gate conducting portion 44 includes a region facing the base regions 14 adjacent thereto on the mesa portion 91 sides and sandwiching the gate insulating film 42, in the depth direction of the semiconductor substrate 10. When a predetermined voltage is applied to the gate conducting portion 44, a channel that is an electron inversion layer is formed in the front layer of the interface where the base region 14 contacts the gate trench.

The dummy trench portion 30 is provided above the drift region 18. The dummy trench portion 30 may have the same structure as the gate trench portion 40. The dummy trench portion 30 includes a dummy trench, a dummy insulating film 32, and a dummy conducting portion 34 formed on the top surface 21 side.

The dummy insulating film 32 is formed covering the inner wall of the dummy trench. The dummy insulating film 32 may be formed by oxidizing or nitriding a semiconductor of the inner wall of the dummy trench.

The dummy conducting portion 34 is formed within the dummy trench and is formed farther inward than the dummy insulating film 32. The dummy insulating film 32 provides insulation between the dummy conducting portion 34 and the semiconductor substrate 10. The dummy trench portion 30 is covered by the interlayer dielectric film 38 on the top surface 21.

The interlayer dielectric film 38 is provided above the top surface of the semiconductor substrate 10. The interlayer dielectric film 38 is provided with one or more contact holes 54 for electrically connecting the emitter electrode 52 and the semiconductor substrate 10. Other contact holes 49 and contact holes 54 may be provided penetrating through the interlayer dielectric film 38 in a similar manner. The emitter electrode 52 is provided above the interlayer dielectric film 38.

Figure 1C:
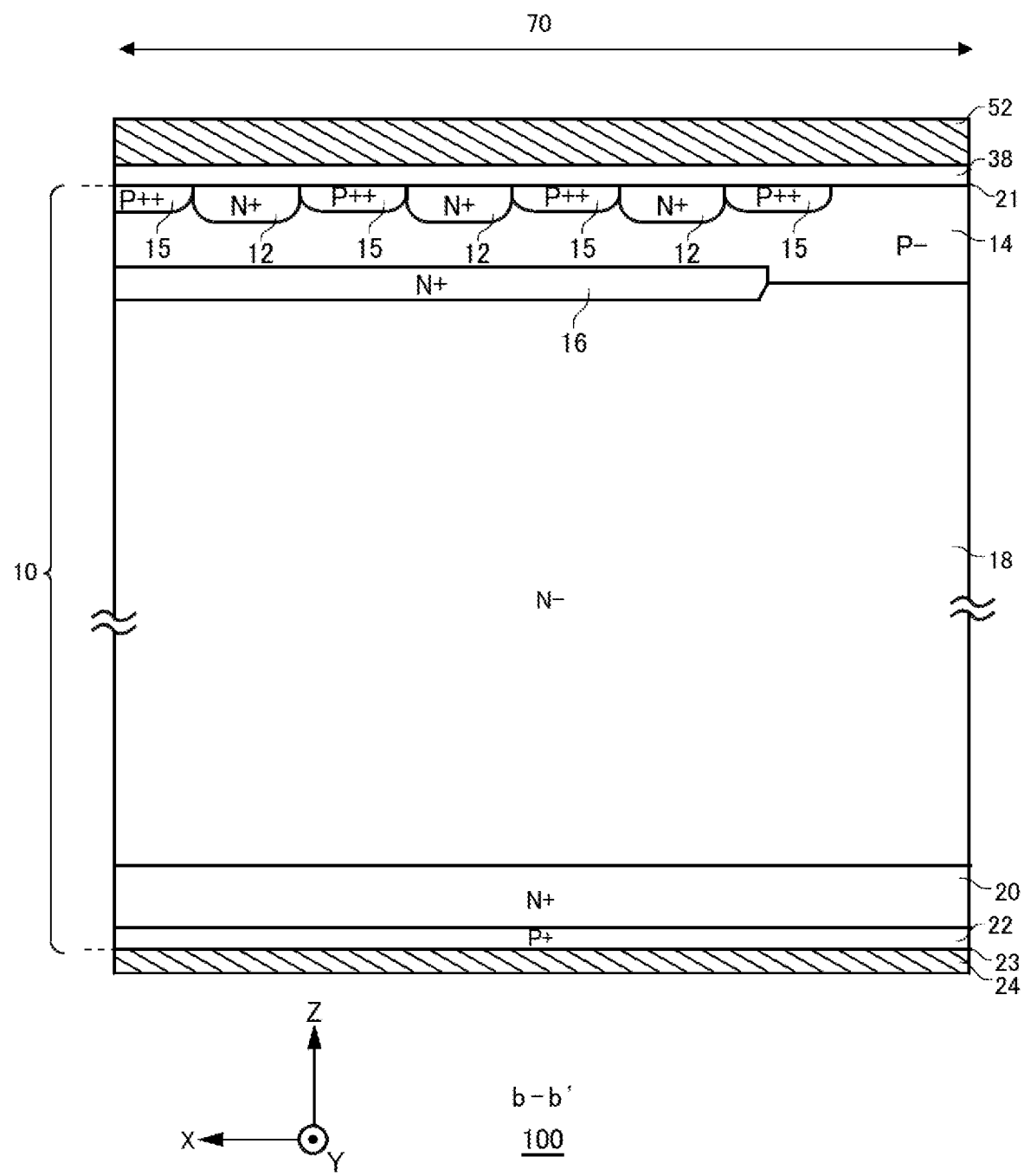
FIG. 1C shows an example of the b-b' cross section in FIG. 1A.

FIG. 1C shows an example of the b-b' cross section in FIG. 1A. The b-b' cross section is the XZ plane passing through the emitter regions 12, the base region 14, and the contact regions 15 in the transistor portion 70.

The contact regions 15 are arranged in an alternating manner with the emitter regions 12, in the top surface 21 of the semiconductor substrate 10. The contact regions 15 are provided to be shallower than the emitter regions 12. In other words, the bottom ends of the contact regions 15 of this example are shallower than the bottom ends of the emitter regions 12.

Here, a case where the contact regions 15 are provided to be shallower than the emitter regions 12 refers to a case where the doping concentration at a depth corresponding to the bottom end of an emitter region 12, in the doping concentration distribution of a contact region 15 in the depth direction, is the doping concentration of the base region 14. In this case, the bottom end of the contact region 15 can be said to be shallower than the bottom end of the emitter region 12. By providing the contact regions 15 to be shallower, it becomes easier for the semiconductor device 100 to ensure a current path, and therefore the IV characteristics can be improved. As an example, the depth of each emitter region 12 is greater than or equal to 0.1 μm and less than or equal to 0.2 μm.

Figure 2:
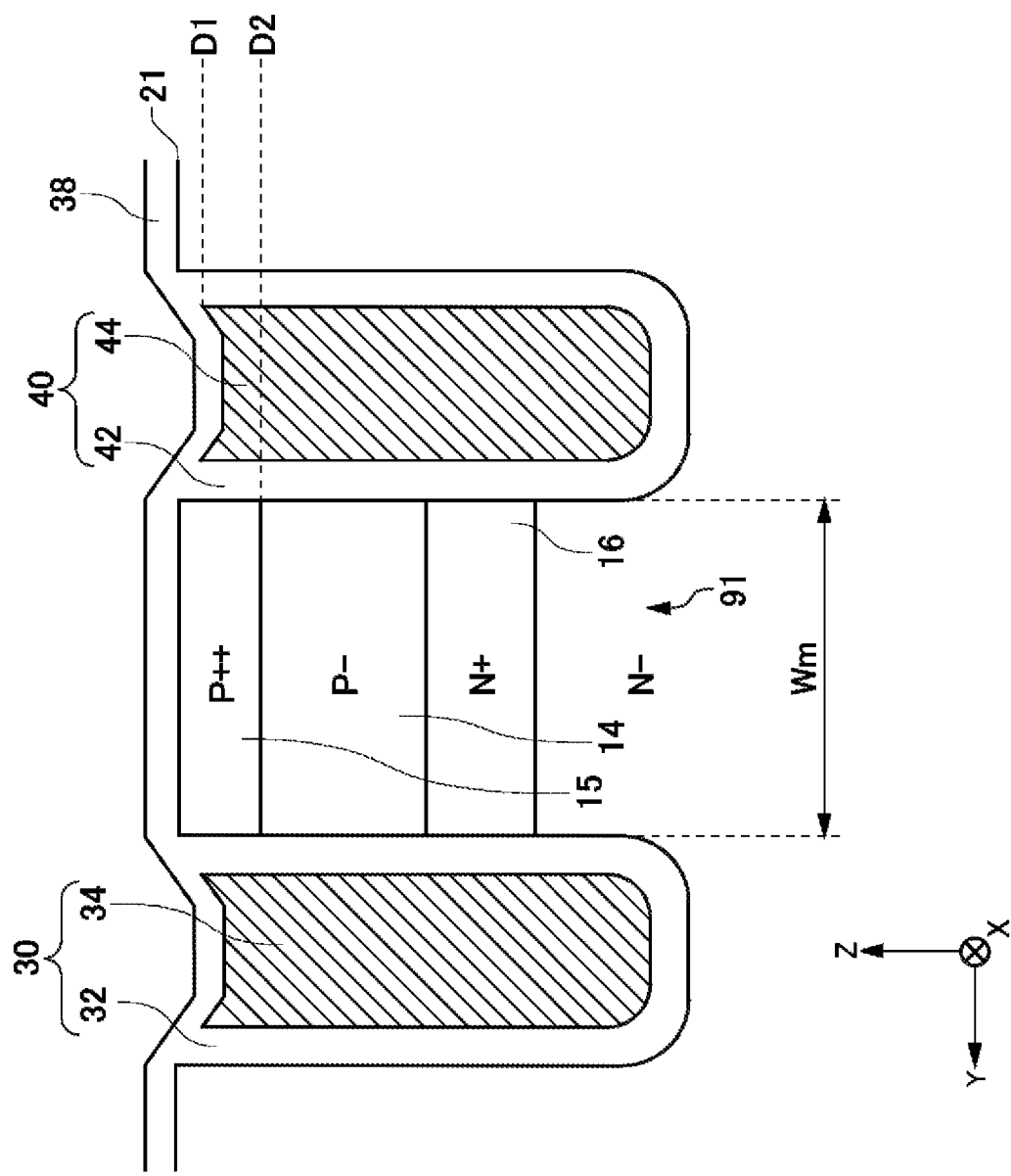
FIG. 2 shows an exemplary enlarged view of a mesa portion 91 according to the first embodiment example.

FIG. 2 shows an exemplary enlarged view of a mesa portion 91 according to the first embodiment example. This drawing shows a mesa portion 91 between a dummy trench portion 30 and a gate trench portion 40.

The mesa width Wm indicates the width of the mesa portion 91 in the Y-axis direction. The mesa portion 91 is preferably shrunk in order to improve the IE effect. The mesa width Wm of this example is less than or equal to 100 nm. Due to the semiconductor device 100 of this example having a narrow mesa width Wm, the entire base region 14 experiences conductivity modulation and current flows through the entire base region 14 including portions of the base region 14 other than the channel region. Furthermore, in a case where the semiconductor device 100 has a mesa width less than or equal to 100 nm, the resistance of the base region 14 is reduced by the conductivity modulation, and the IV characteristics of the semiconductor device 100 are improved.

The depth D1 indicates the depth of the top end of the gate conducting portion 44 from the top surface 21 of the semiconductor substrate 10. In this way, in the actual semiconductor device 100, there are cases where the top end of the gate conducting portion 44 is formed to be deeper than the top surface 21, due to the semiconductor processing.

The depth D2 indicates the depth of the bottom end of the contact region 15 from the top surface 21. The depth D2 is preferably greater than the depth D1. In other words, the contact region 15 is preferably provided opposite at least the gate conducting portion 44. Due to this, when a negative gate bias is applied to the gate conducting portion 44, a hole inversion layer is formed near the gate trench portion 40 opposite the gate conducting portion 44, and it is easy for the holes within the base region 14 to be drawn out. Therefore, latch-up of the semiconductor device 100 is restricted.

The shallower the contact region 15, the easier it is for current to flow and the greater the improvement of the IV characteristics. On the other hand, if the contact region 15 is too shallow, the region of the contact region 15 opposite the gate conducting portion 44 becomes small, and there are cases where it is difficult for the holes of the base region 14 to be drawn out.

In the semiconductor device 100 of the present example, the bottom end of the contact region 15 is deeper than the top end of the gate conducting portion 44. Therefore, even in a case where the depth D1 of the top end of the gate conducting portion 44 is great, a region facing the contact region 15 is included on the top surface side of the semiconductor substrate 10, and therefore it is easy for the holes within the base region 14 to be drawn out when the negative gate bias is applied to the gate conducting portion 44. Due to this, latch-up of the semiconductor device 100 can be restricted.

As described above, the semiconductor device 100 of this example has a mesa width Wm less than or equal to 100 nm, and includes a contact region 15 that is provided to be shallower than the emitter region 12. In this way, by adjusting the mesa width Wm and the depth of the contact region 15, it is possible to improve the IV characteristics and restrict latch-up.

For example, the semiconductor device 100 can conductivity modulate the base region 14 due to the IE effect resulting from the mesa width Wm being less than or equal to 100 nm. Due to this, the IV characteristics of the semiconductor device 100 are improved. In particular, by providing the contact region 15 to be shallow, it is easy to realize the effect of improving the IV characteristics.

On the other hand, when turned OFF, since the semiconductor device 100 has a mesa width Wm less than or equal to 100 nm, the entire channel region can be made P type by applying the negative gate bias. Due to this, the semiconductor device 100 can cut off the current when turned OFF, and restrict latch-up. Accordingly, the semiconductor device 100 can cut off a large current with a low ON resistance using the gate voltage drive.

Figure 3:
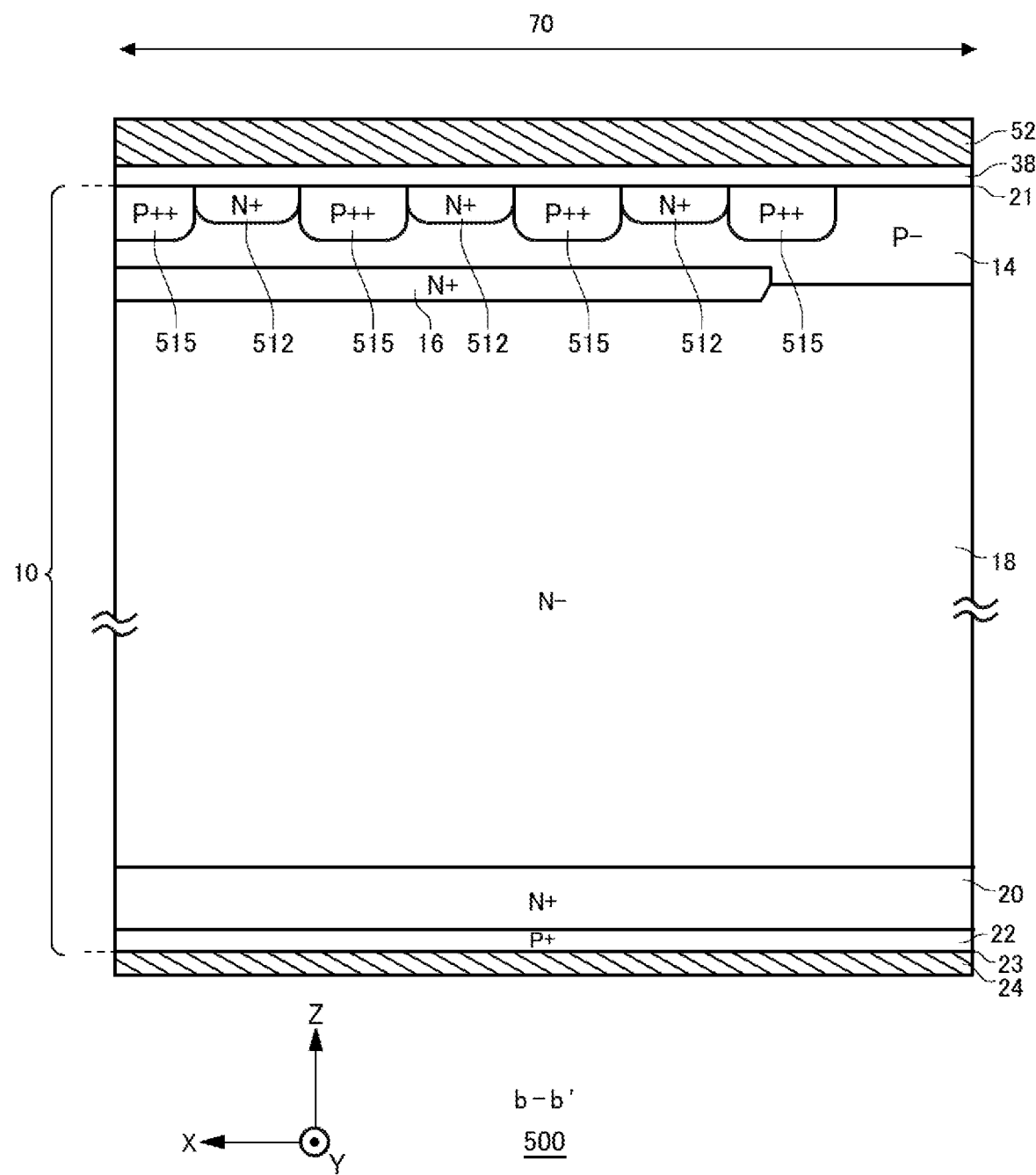
FIG. 3 shows a configuration of a semiconductor device 500 according to a comparative example.

FIG. 3 shows a configuration of a semiconductor device 500 according to a comparative example. In the semiconductor device 500, contact regions 515 are formed to be deeper than emitter regions 512, in order to improve the drawing out of the holes and restrict latch-up in a case where the mesa width is less than or equal to 100 nm. However, in a case here the contact regions 515 that are deeper than the emitter regions 12 are included, a high-concentration P type region is formed within the base region 14, and conductivity modulation cannot be realized for the entire base region 14. Therefore, the semiconductor device 500 obstructs the conductivity modulation of the base region 14, and the current path becomes narrow. Due to this, there is a large voltage drop in the base region 14, and the IV characteristics are worsened.

On the other hand, the semiconductor device 100 has a mesa width less than or equal to 100 nm and includes contact regions 15 that are shallower than the emitter regions 12, and therefore it is possible to reduce the resistance of the base region 14 by conductivity modulating the base region 14, to improve the IV characteristics. Furthermore, the semiconductor device 100 can restrict the drop in the latch-up tolerance by applying a negative gate bias.

Figure 4A:
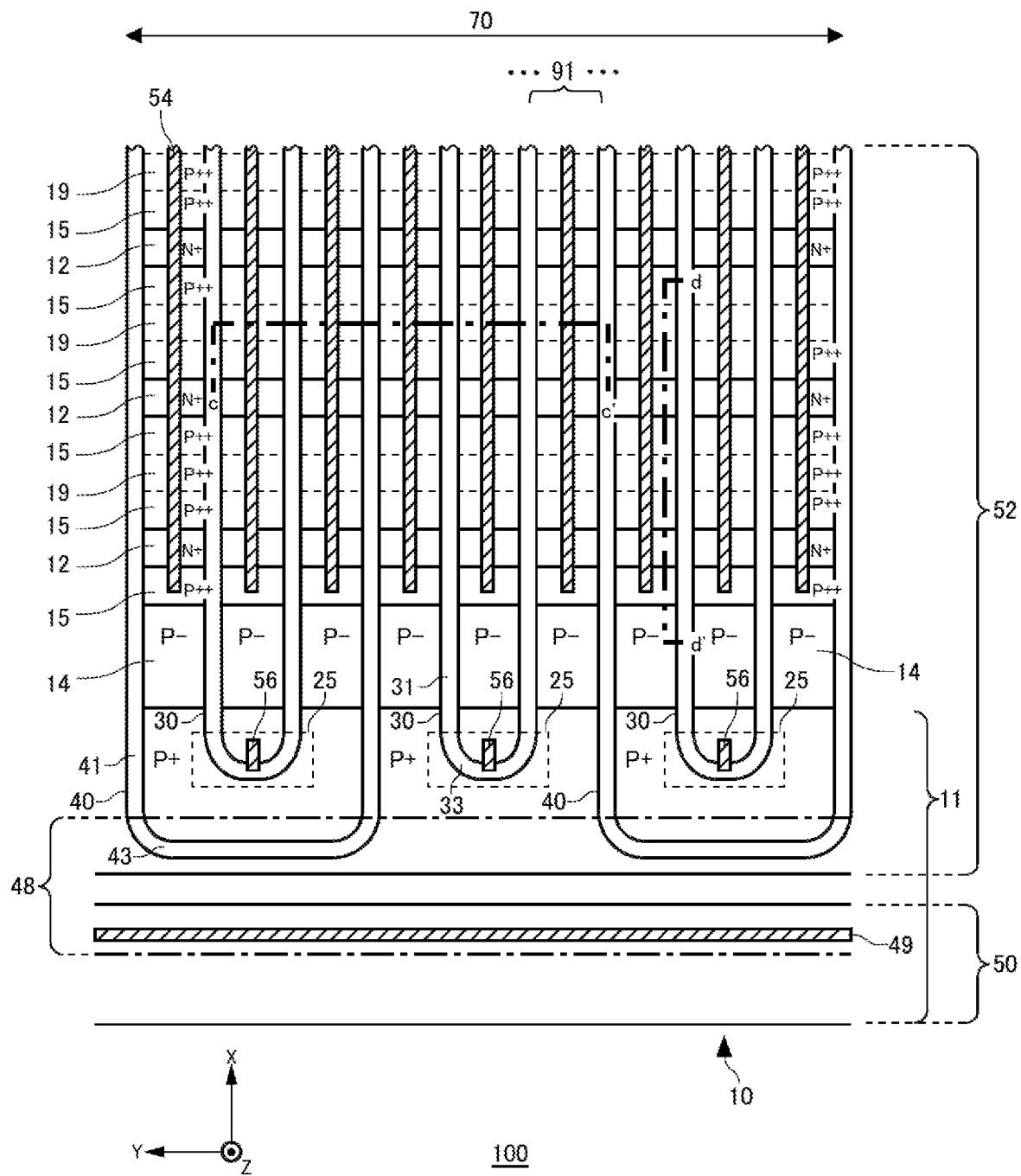
FIG. 4A shows an exemplary configuration of a semiconductor device 100 according to a second embodiment example.

FIG. 4A shows an exemplary configuration of a semiconductor device 100 according to a second embodiment example. The semiconductor device 100 of this example differs from the semiconductor device 100 according to the first embodiment example by including carrier path layers 19.

Each carrier path layer 19 is provided between adjacent emitter regions 12 in a mesa portion 91. Each carrier path layer 19 of this example is connected to a contact region 15. The carrier path layer 19 is provided in a region sandwiched by contact regions 15, in a region between adjacent emitter regions 12. The carrier path layer 19 has a second conductivity type and a higher doping concentration than the base region 14. The carrier path layer 19 is P++ type, for example. The carrier path layer 19 may have the same doping concentration as the contact region 15.

The carrier path layer 19 of the present example connects the contact region 15 and the drift region 18 within the base region 14. Accordingly, the carrier path layer 19 can draw out the holes within the base region 14 to the contact region 15. Due to this, the carrier path layer 19 can restrict latch-up of the semiconductor device 100.

Figure 4B:
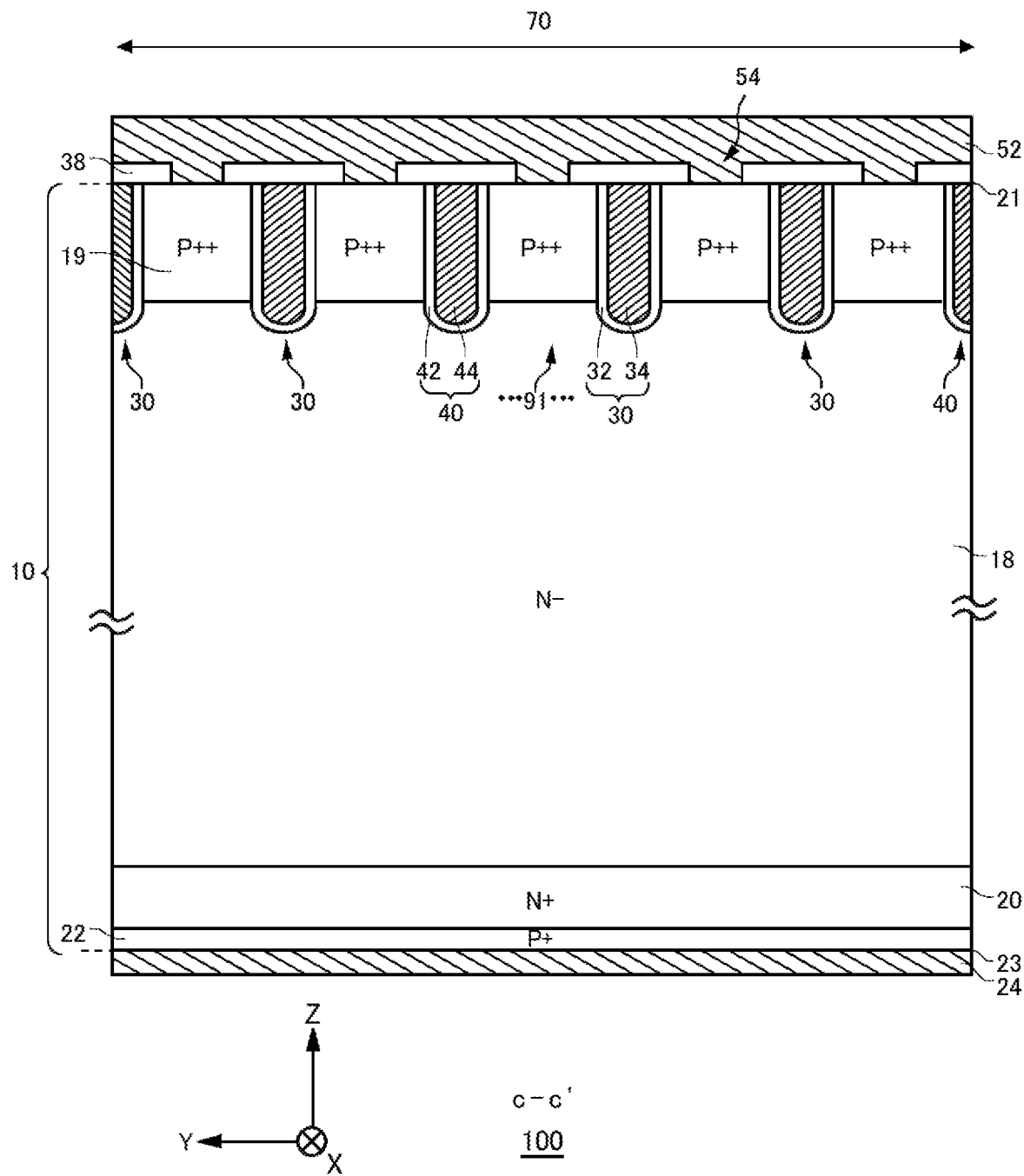
FIG. 4B shows an example of the c-c' cross section in FIG. 4A.

FIG. 4B shows an example of the c-c' cross section in FIG. 4A. The c-c' cross section is the YZ plane passing through the emitter region 12, the base region 14, and the carrier path layer 19 in the transistor portion 70.

The carrier path layer 19 extends in a depth direction of the semiconductor substrate 10 from the top surface 21 of the mesa portion 91. The carrier path layer 19 of this example is provided extending to a depth that is the same as the depth where the accumulation region 16 is provided. The carrier path layer 19 of this example is provided extending from the dummy trench portion 30 to the gate trench portion 40 in the mesa portion 91.

Figure 4C:
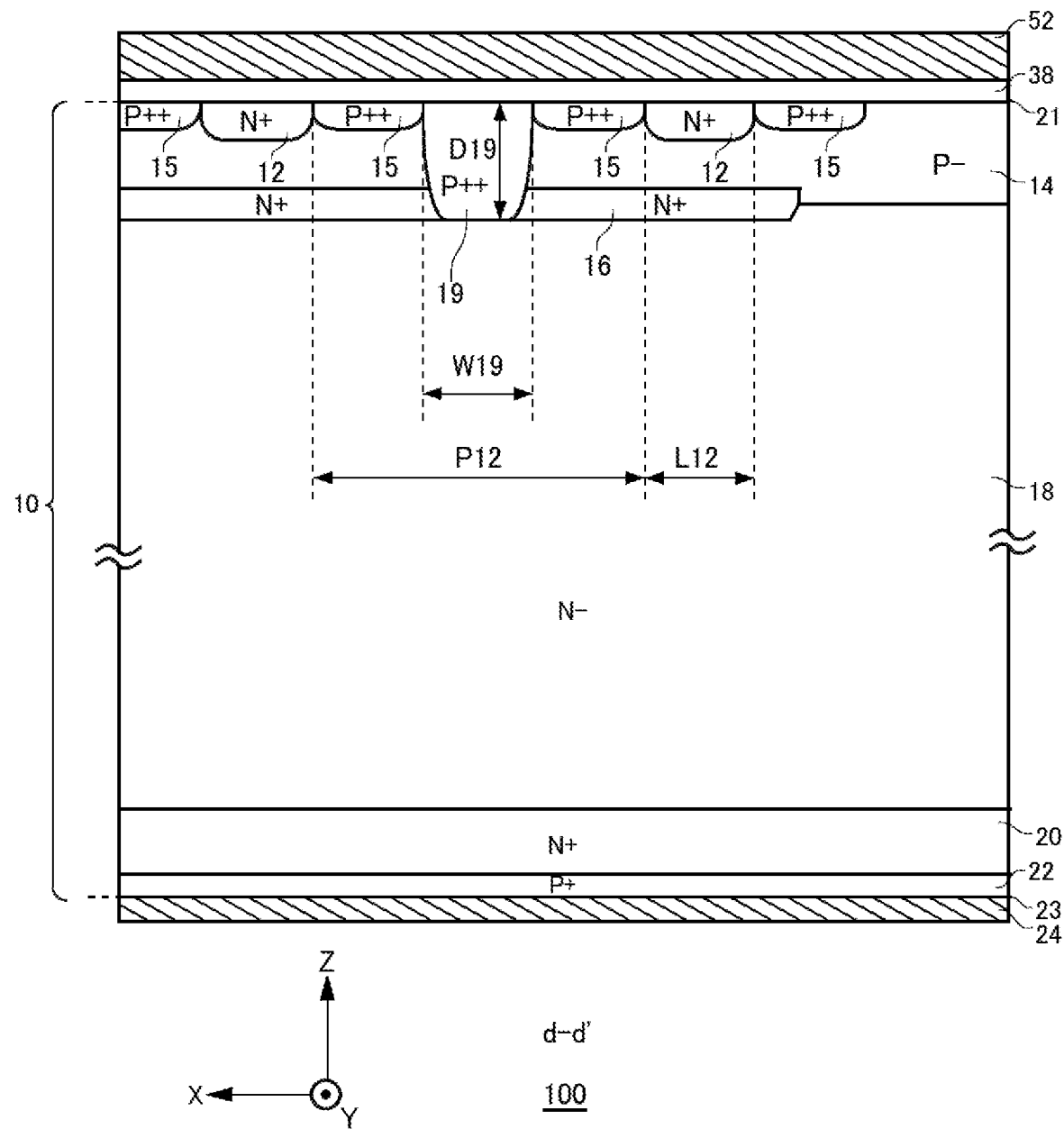
FIG. 4C shows an example of the d-d' cross section in FIG. 4A.

FIG. 4C shows an example of the d-d' cross section in FIG. 4A. The d-d' cross section is the XZ plane passing through emitter regions 12, the base region 14, contact regions 15, and the carrier path layer 19 in the transistor portion 70.

The interval P12 is an interval between emitter regions 12 in the X-axis direction at the top surface 21. The interval P12 is preferably greater than a width L12 of an emitter region 12 in the X-axis direction. As an example, the interval P12 is greater than or equal to 1.4 µm and less than or equal to 1.8 µm. The interval P12 of this example is 1.6 µm. Furthermore, the width L12 is greater than or equal to 0.2 µm and less than or equal to 0.6 µm. The width L12 of this example is 0.4 µm.

A width W19 is the width of a carrier path layer 19 in the X-axis direction at the top surface 21. The width W19 is set in consideration of the tradeoff between the IV characteristics of the semiconductor device 100 and the latch-up tolerance. Specifically, it becomes easy to improve the IV characteristics of the semiconductor device 100 by making the width W19 smaller, and it becomes easy to improve the latch-up tolerance of the semiconductor device 100 by making the width W19 larger. As an example, the width W19 is greater than or equal to 0.4 µm and less than or equal to 1.2 µm.

The carrier path layer 19 occupies a predetermined percentage of the region between adjacent emitter regions 12 at the top surface 21 of the mesa portion 91. The occupancy percentage of the carrier path layer 19 of the present example is approximately 33%. The occupancy percentage of the carrier path layer 19 is shown as a ratio of the surface area of the carrier path layer 19 to the surface area of the region between the adjacent emitter regions 12. In a case where the emitter regions 12 and the carrier path layer 19 are provided extending in the Y-axis direction between trench portions, the occupancy percentage of the carrier path layer 19 is shown by W19/P12, using the length in the X-axis direction. As an example, the occupancy percentage of the carrier path layer 19 is greater than or equal to 25% and less than or equal to 75%.

A depth D19 is the depth of the bottom end of the carrier path layer 19, using the top surface 21 of the semiconductor substrate 10 as a reference. The depth D19 is preferably greater than or equal to an interval between the carrier path layer 19 and the emitter region 12, at the top surface 21 of the mesa portion 91. The depth D19 of this example is 0.8 µm. In this example, the interval between the carrier path layer 19 and the emitter region 12 is shown by (P12−W19)/2.

The carrier path layer 19 is provided at a position including at least the center between the adjacent emitter regions 12, at the top surface of the mesa portion 91. In other words, the carrier path layer 19 is provided at least at a position distanced P12/2 from and adjacent emitter region 12. In this case, the carrier path layer 19 is preferably provided equidistant from the centers of the adjacent emitter regions 12, in the region between the adjacent emitter regions 12.

Figure 5A:
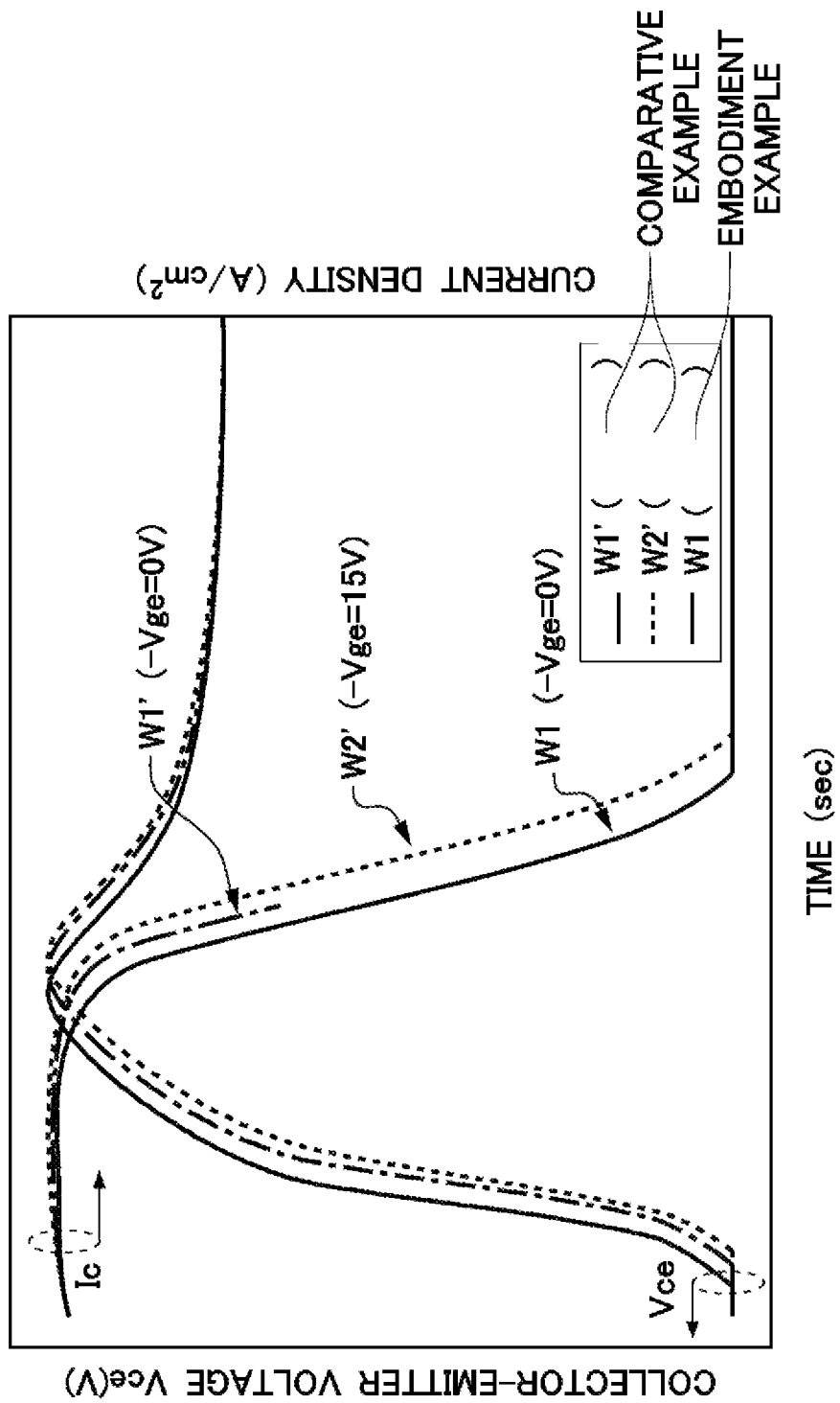
FIG. 5A shows an exemplary turn-OFF waveform of a semiconductor device.

FIG. 5A shows an exemplary turn-OFF waveform of a semiconductor device. The vertical axis indicates the collector-emitter voltage Vce (V) and the current density (A/cm$^2$) of the collector current Ic, and the horizontal axis indicates time (sec). The waveform W1 corresponds to the present embodiment example, and the waveforms W1' and W2' correspond to the comparative examples.

The waveform W1' shows the turn-OFF waveform of a semiconductor device that does not include the carrier path layer 19. In the waveform W1', the gate-emitter voltage is −Vge=0 V. In the semiconductor device that does not include the carrier path layer 19, in a case where −Vge=0 V, the hole inversion layer is not formed in the range of the gate trench portion 40, and therefore the holes of the base region 14 cannot be drawn out. Therefore, carriers remain in the base region 14 because the conductivity modulation of the base region 14 cannot be eliminated, and it is impossible to restrict latch-up. Due to this, in the semiconductor device that does not include the carrier path layer 19, it is impossible to cut off a large current when −Vge=0 V.

The waveform W2' shows the turn-OFF waveform of a semiconductor device that does not include the carrier path layer 19. In the waveform W2', the gate-emitter voltage is −Vge=15 V. Even in a case where the carrier path layer 19 is not included, it is possible to restrict latch-up by setting the gate-emitter voltage to −Vge=15 V.

The waveform W1 shows the turn-OFF waveform of the semiconductor device 100 including the carrier path layer 19. In the waveform W1, the gate-emitter voltage is −Vge=0 V. The semiconductor device 100 can draw out the holes of the base region 14 from the carrier path layer 19, without depending on the gate-emitter voltage due to the inclusion of the carrier path layer 19. Due to this, the semiconductor device 100 can restrict latch-up even in a case where −Vge=0 V. Accordingly, the semiconductor device 100 can restrict latch-up while improving the IV characteristics, even in a case where the mesa width Wm is less than or equal to 100 nm.

Figure 5B:
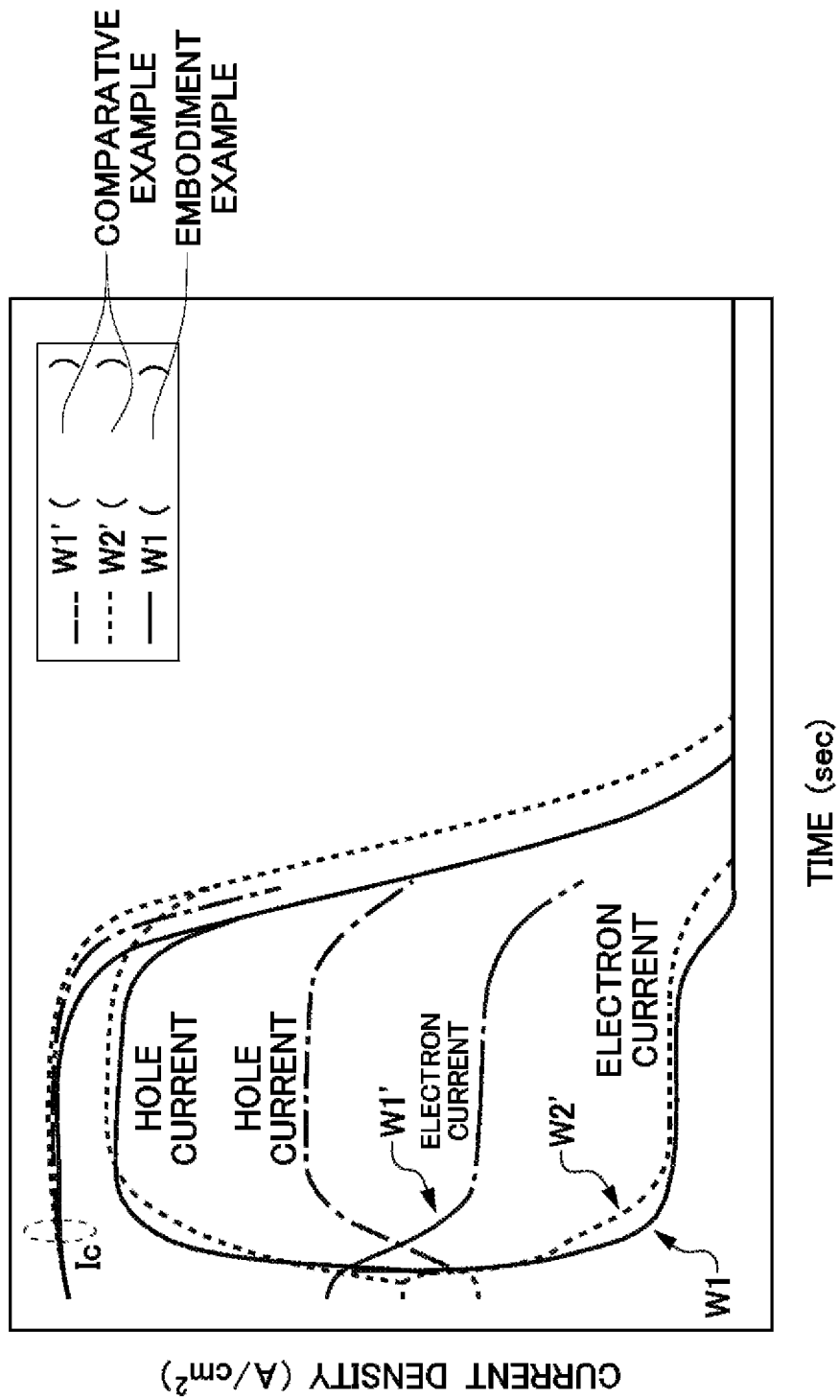
FIG. 5B shows the hole current and electron current of the collector current Ic of FIG. 5A.

FIG. 5B shows the hole current and electron current of the collector current Ic of FIG. 5A. The conditions of the waveform W1', the waveform W2', and the waveform W1 are the same as in the case of FIG. 5A. The waveforms of this drawing show the electron current and hole current included in the collector current Ic, in addition to the collector current Ic. The waveform of the collector current Ic is the same as in the case of FIG. 5A.

For the waveform W1', the semiconductor device does not include the carrier path layer 19, and therefore the carriers of the base region 14 are not drawn out and conductivity modulation remains as-is. Accordingly, for the waveform W1', the electron current continues to flow in addition to the hole current. In this way, for the waveform W1', the conductivity modulation of the base region 14 cannot be eliminated, and the ratio of the electron current in the collector current Ic becomes large due to the remaining electron paths.

Figure 5C:
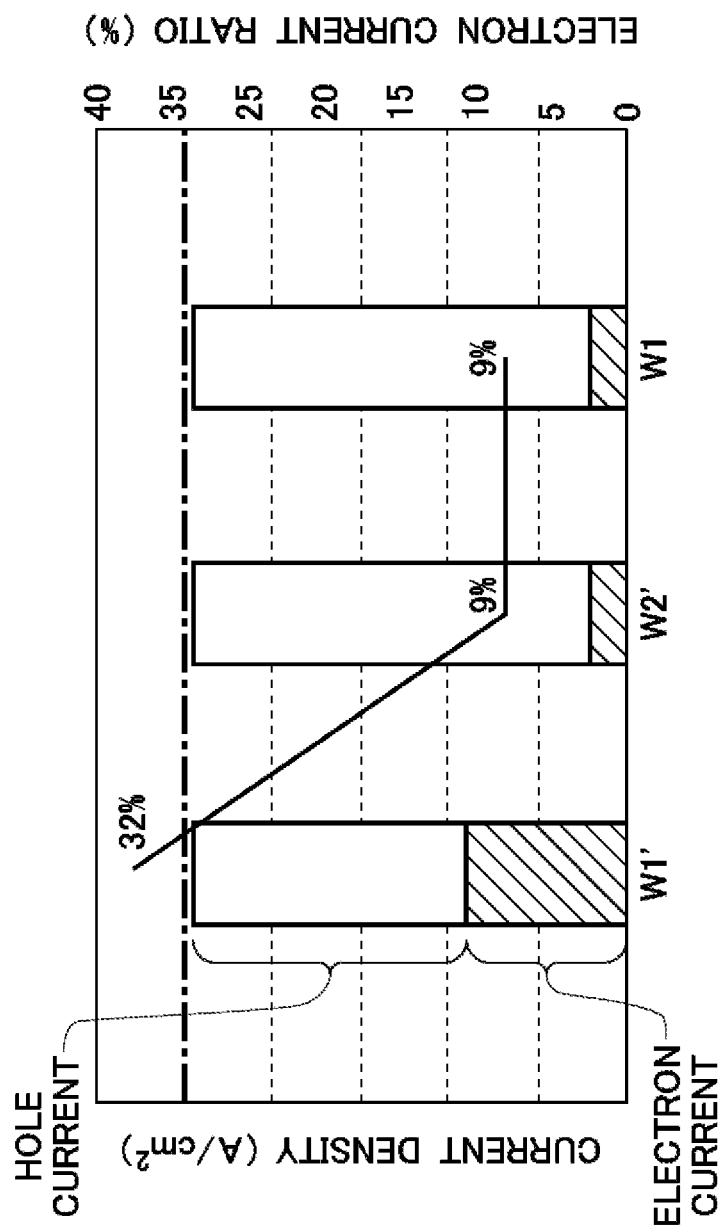
FIG. 5C shows a breakdown of the hole current and electron current of the collector current Ic of FIG. 5A.

FIG. 5C shows a breakdown of the hole current and electron current of the collector current Ic of FIG. 5A. This drawing shows a breakdown of the hole current and the electron current at the peak timing of the collector current Ic. The bar graph shows the electron current density (A/cm$^2$) corresponding to the waveform W1', the waveform W2', and the waveform W1. In the bar graph, the hatched region indicates the ratio of the electron current, and the region that is not hatched indicates the ratio of the hole current. The broken line graph indicates the ratios (%) of the electron current corresponding to the waveform W1', the waveform W2', and the waveform W1.

In the graph showing the waveform W1', the ratio of the electron current is greater than that of the other waveforms W2' and W1. For example, as shown by the waveform W1', in a case where the carrier path layer 19 is not included, the electron current occupies 37% of the total current of the collector current Ic at −Vge=0 V.

On the other hand, as shown in the waveform W1, by forming the carrier path layer 19, it is possible to reduce the ratio of the electron current to the total current of the collector current Ic to approximately 9%. This is a level equivalent to the case of a turn-OFF at −Vge=15 V in the semiconductor device that does not include the carrier path layer 19, as shown in the waveform W2'.

In this way, the semiconductor device 100 of this example can restrict the flow of the electron current by providing the carrier path layer 19. Accordingly, the semiconductor device 100 can reduce the ratio of the electron current occupying the collector current IV in a manner equal to that of the case of a turn-OFF at −Vge=15 V.

Figure 6:
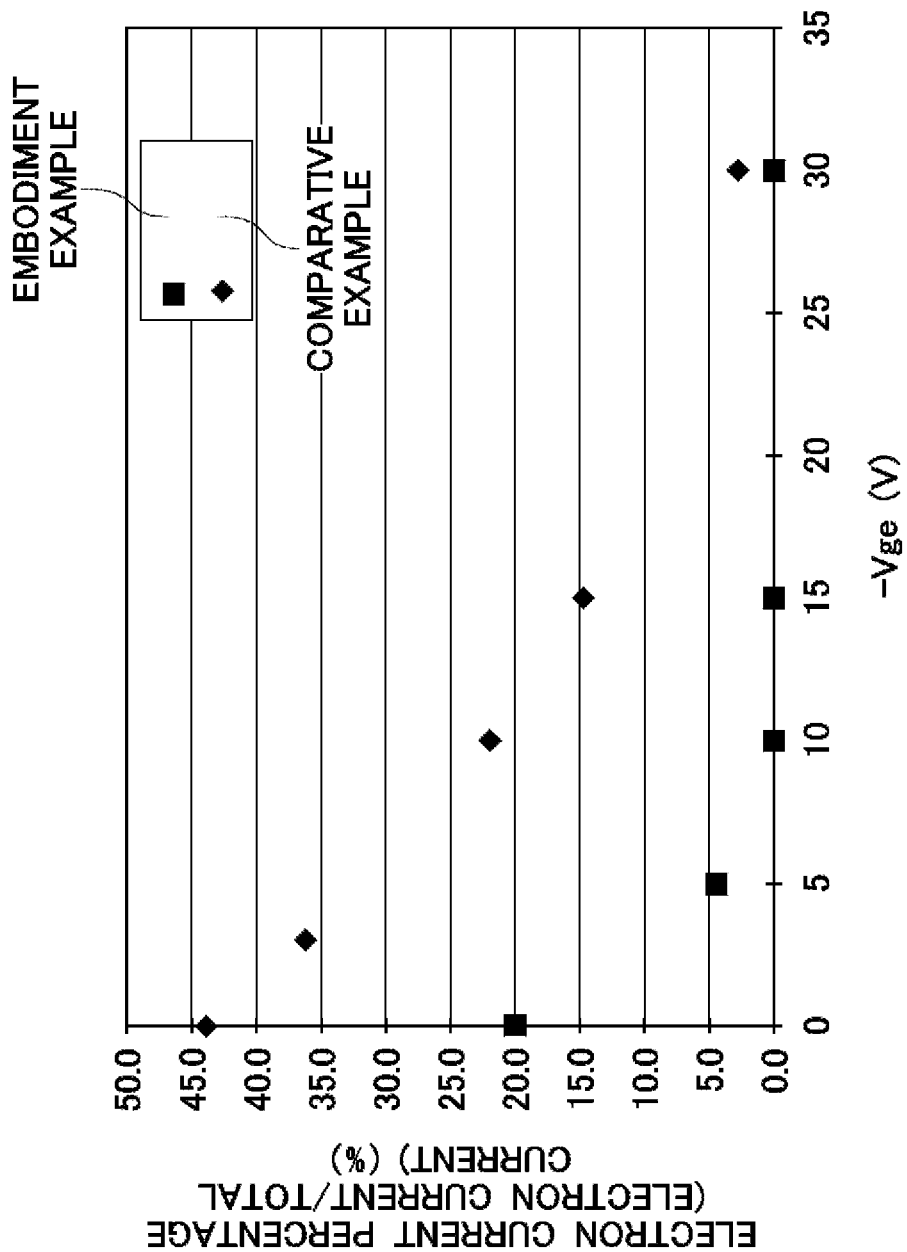
FIG. 6 shows the −Vge dependency of the electron current ratio.

FIG. 6 shows the −Vge dependency of the electron current ratio. The vertical axis indicates the electron current ratio (electron current/total current) (%), and the horizontal axis indicates −Vge (V). By increasing −Vge, the ratio of the electron current occupying the total current of the collector current Ic tends to increase.

In the embodiment examples including the carrier path layer 19, the electron current ratio can be made smaller than in the comparative examples that do not include the carrier path layer 19. In particular, in the semiconductor device 100 according to the embodiment example, the electron current ratio can be reduced regardless of −Vge. For example, the semiconductor device 100 of this example can eliminate the carriers in the base region 14 and cut off the electron current by setting −Vge>10 V.

Figure 7:
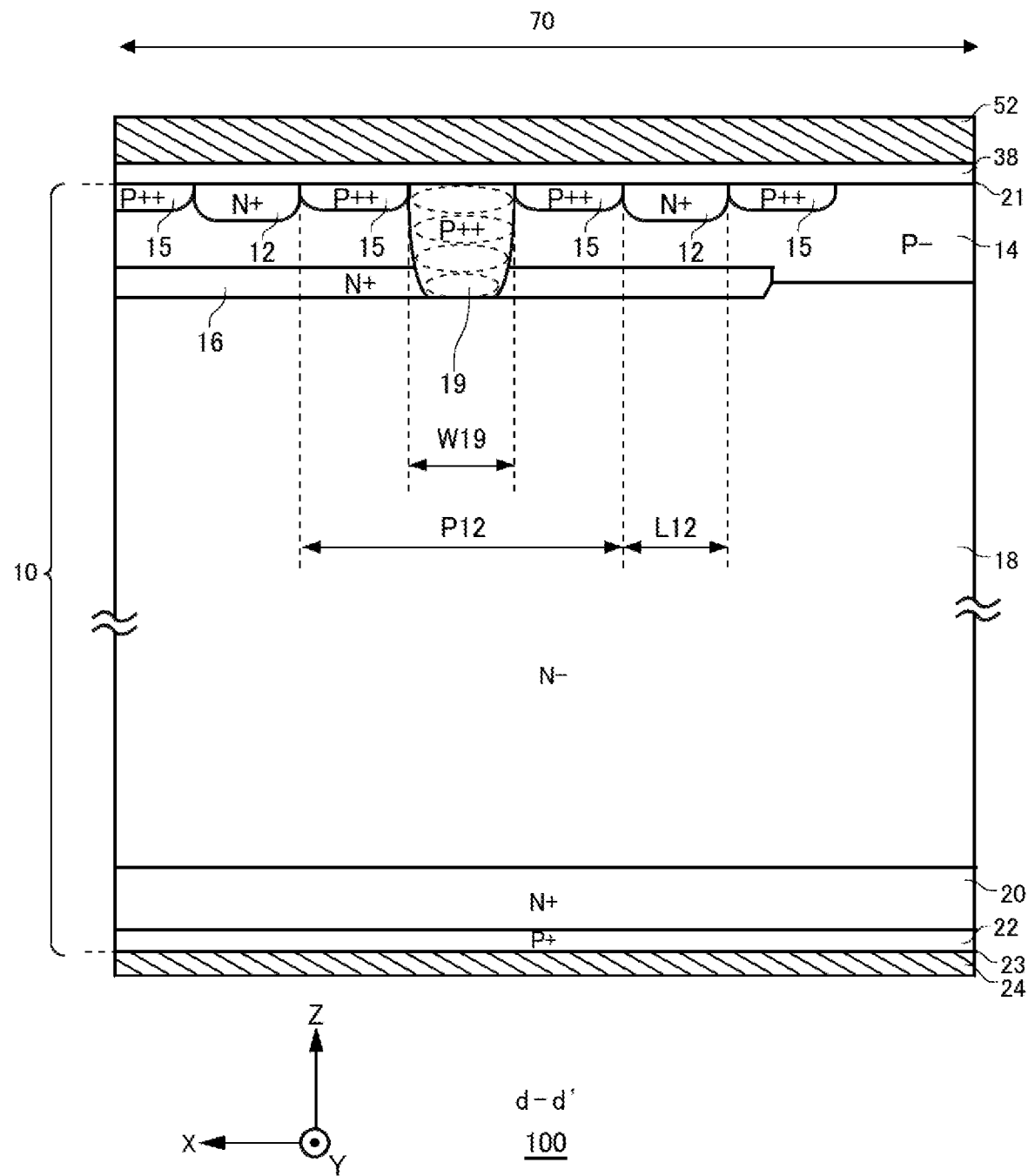
FIG. 7 shows an exemplary configuration of a semiconductor device 100 according to a third embodiment example.

FIG. 7 shows an exemplary configuration of the semiconductor device 100 according to a third embodiment example. This drawing shows an example of the d-d' cross section in FIG. 4A. The semiconductor device 100 of this example forms the carrier path layer 19 using multistage ion injection. In this example, the carrier path layer 19 is formed using four-stage ion injection, but the number of ion injections is not limited to the number of this example.

Figure 8:
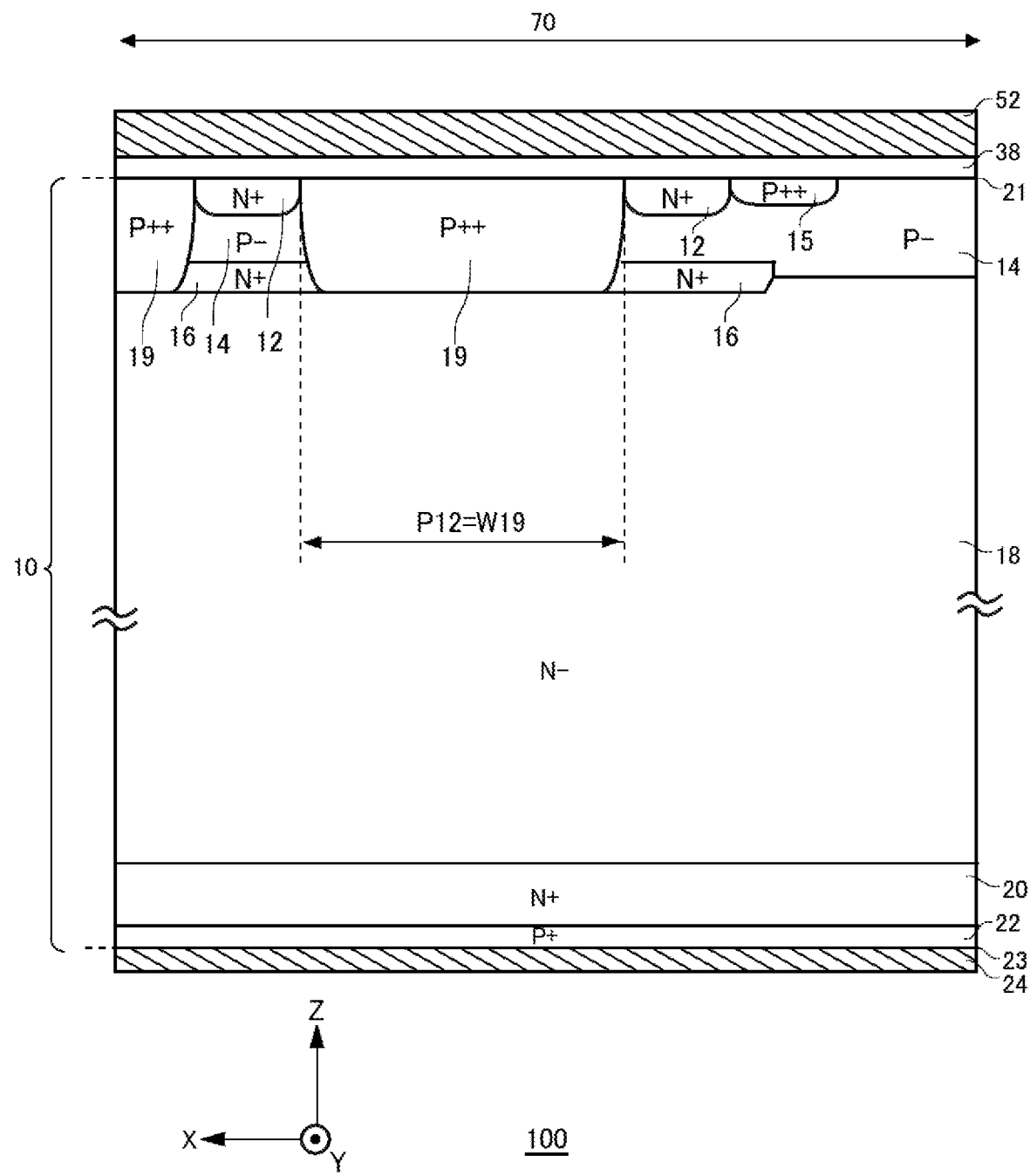
FIG. 8 shows an exemplary configuration of a semiconductor device 100 according to a fourth embodiment example.

FIG. 8 shows an exemplary configuration of a semiconductor device 100 according to a fourth embodiment example. The semiconductor device 100 of this example differs from the semiconductor device 100 according to the second embodiment example in that the carrier path layer 19 is provided on all surfaces between the adjacent emitter regions 12.

The width W19 of the carrier path layer 19 occupies the entire region between adjacent emitter regions 12. In other words, the width W19 is equal to the interval P12 between adjacent emitter regions 12. In this case, the occupancy ratio of the carrier path layer 19 is 100%. The semiconductor device 100 of this example can further reduce the ratio of the electron current occupying the collector current Ic, by increasing the occupancy percentage of the carrier path layer 19. In this way, latch-up can be restricted.

Figure 9:
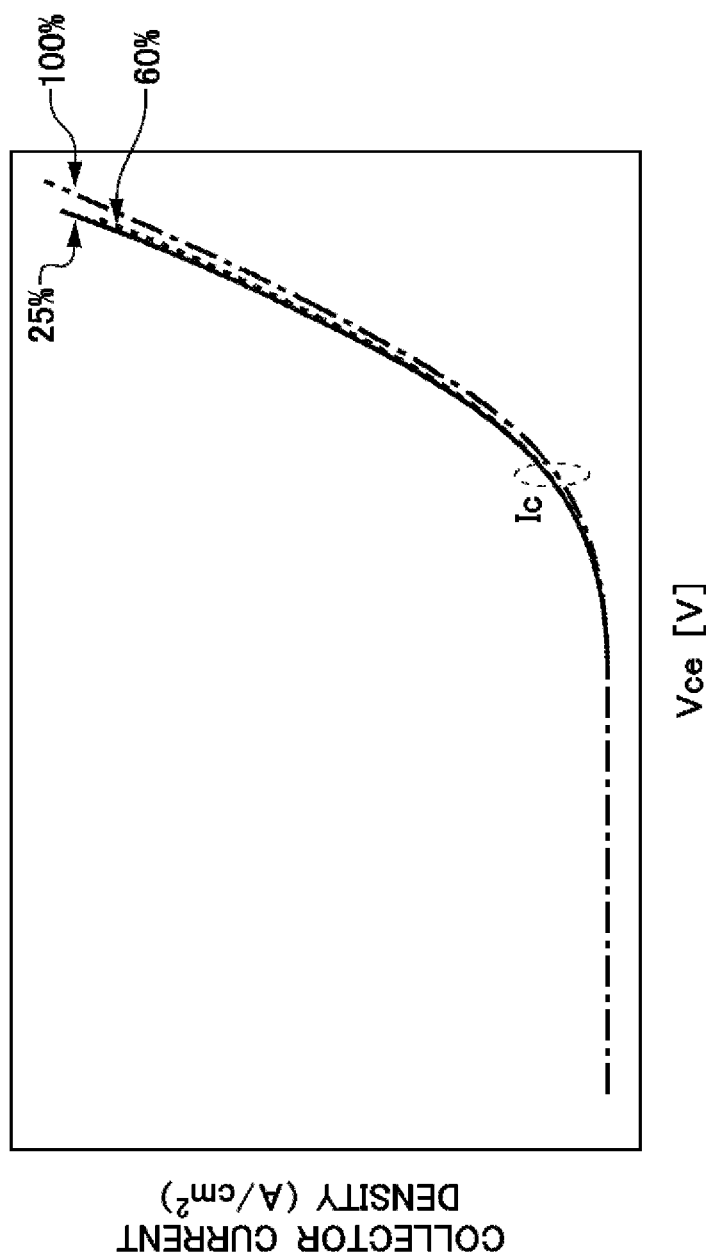
FIG. 9 shows the occupancy percentage of the carrier path layer 19 occupying the region between adjacent emitter regions 12.

FIG. 9 shows the occupancy percentage of the carrier path layer 19 occupying the region between adjacent emitter regions 12. When the occupancy percentage of the carrier path layer 19 is high, the electron path is limited, and therefore there are cases where the IV characteristics of the semiconductor device are worsened. In the semiconductor device 100, the occupancy percentage of the carrier path layer 19 is preferably increased to a degree that does not worsen the IV characteristics. For example, the occupancy percentage of the carrier path layer 19 may be greater than or equal to 25% and less than or equal to 75%.

Accordingly, by lowering the occupancy percentage of the carrier path layer 19, the IV characteristics of the semiconductor device 100 are improved. In other words, from the viewpoint of improving the IV characteristics of the semiconductor device 100, it is preferable to lower the occupancy percentage of the carrier path layer 19.

On the other hand, in the semiconductor device 100, the holes within the base region 14 become easy to draw out due to the carrier path layer 19, without being dependent of −Vge, by increasing the occupancy percentage of the carrier path layer 19. By increasing the occupancy percentage of the carrier path layer 19, it is possible to restrict latch-up even when −Vge=0. In other words, from the viewpoint of latch-up restriction of the semiconductor device 100, it is preferable to increase the occupancy percentage of the carrier path layer 19.

In this way, when setting the occupancy percentage of the carrier path layer 19, there is a tradeoff relationship between the latch-up restriction and the improvement of the IV characteristics. Accordingly, the occupancy percentage of the carrier path layer 19 should be appropriately determined according to the characteristics demanded for the semiconductor device 100.

Figure 10A:
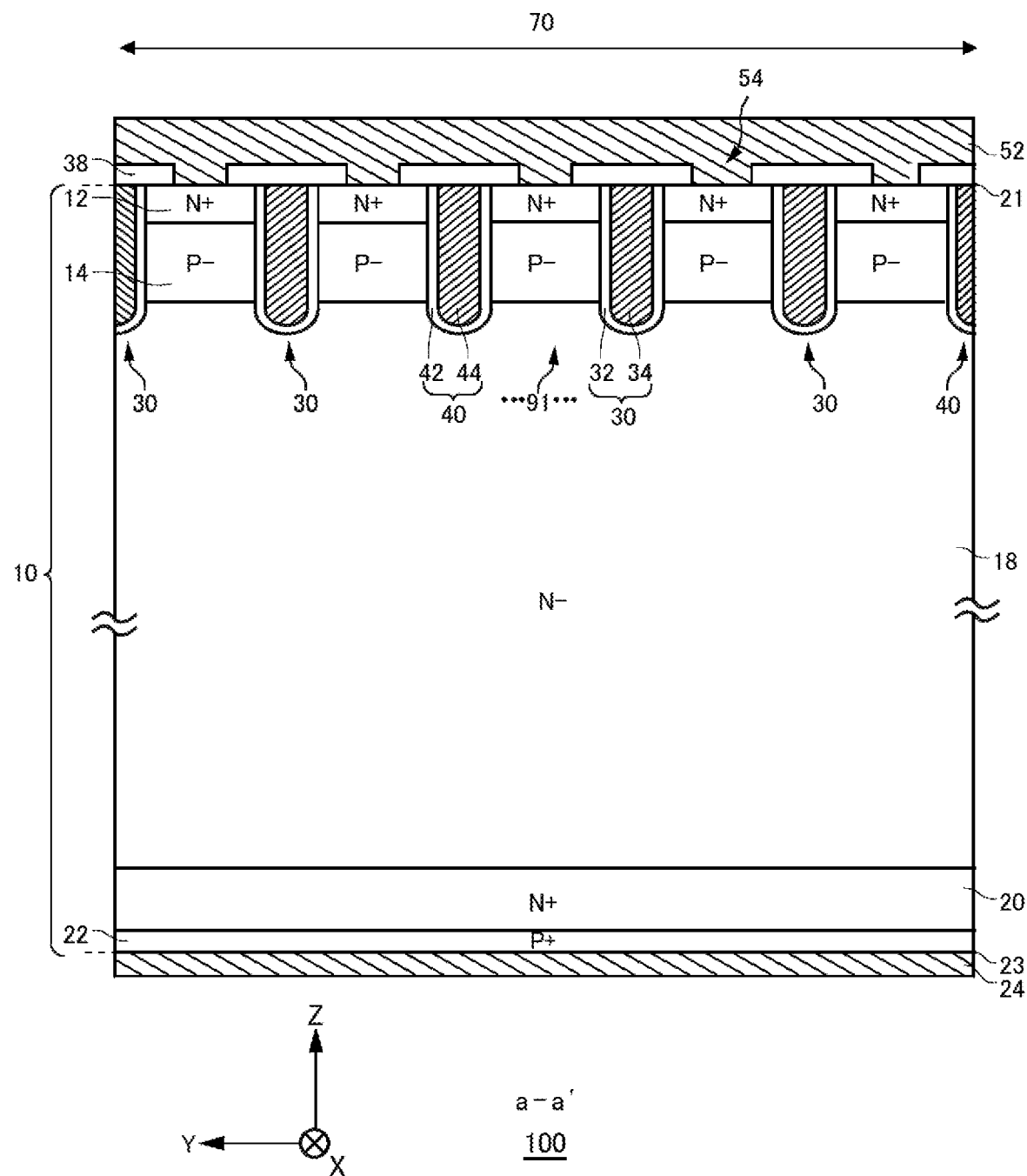
FIG. 10A shows an exemplary configuration of a semiconductor device 100 according to a fifth embodiment example.
Figure 10B:
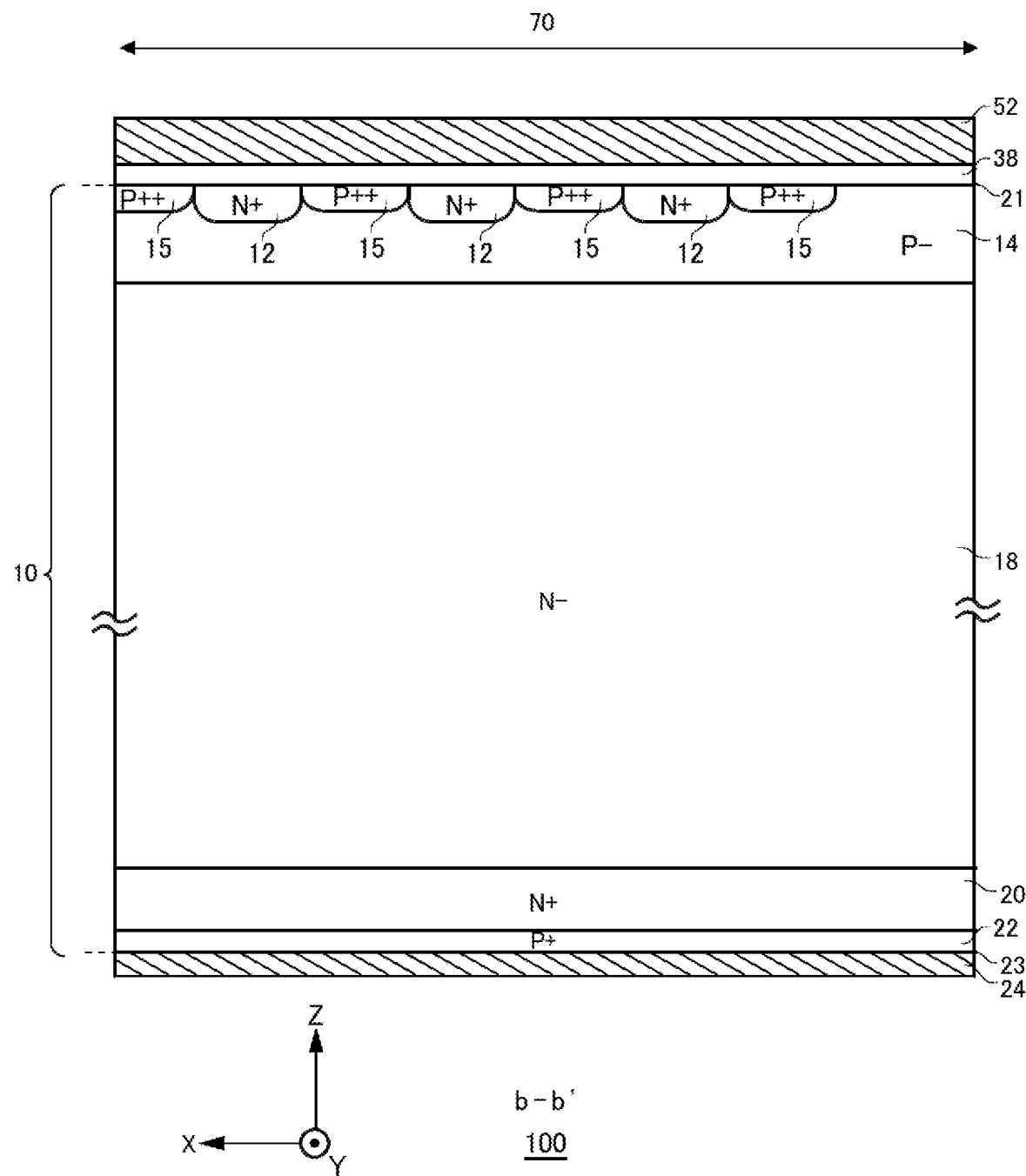
FIG. 10B shows an exemplary configuration of a semiconductor device 100 according to a fifth embodiment example.

FIG. 10A and FIG. 10B show an exemplary configuration of a semiconductor device 100 according to a fifth embodiment example. FIG. 10A shows an example of the a-a' cross section in FIG. 1A. FIG. 10B shows an example of the b-b' cross section in FIG. 1A.

The semiconductor device 100 of this example differs from the semiconductor device 100 according to the first embodiment example by not being provided with the accumulation region 16.

Figure 10C:
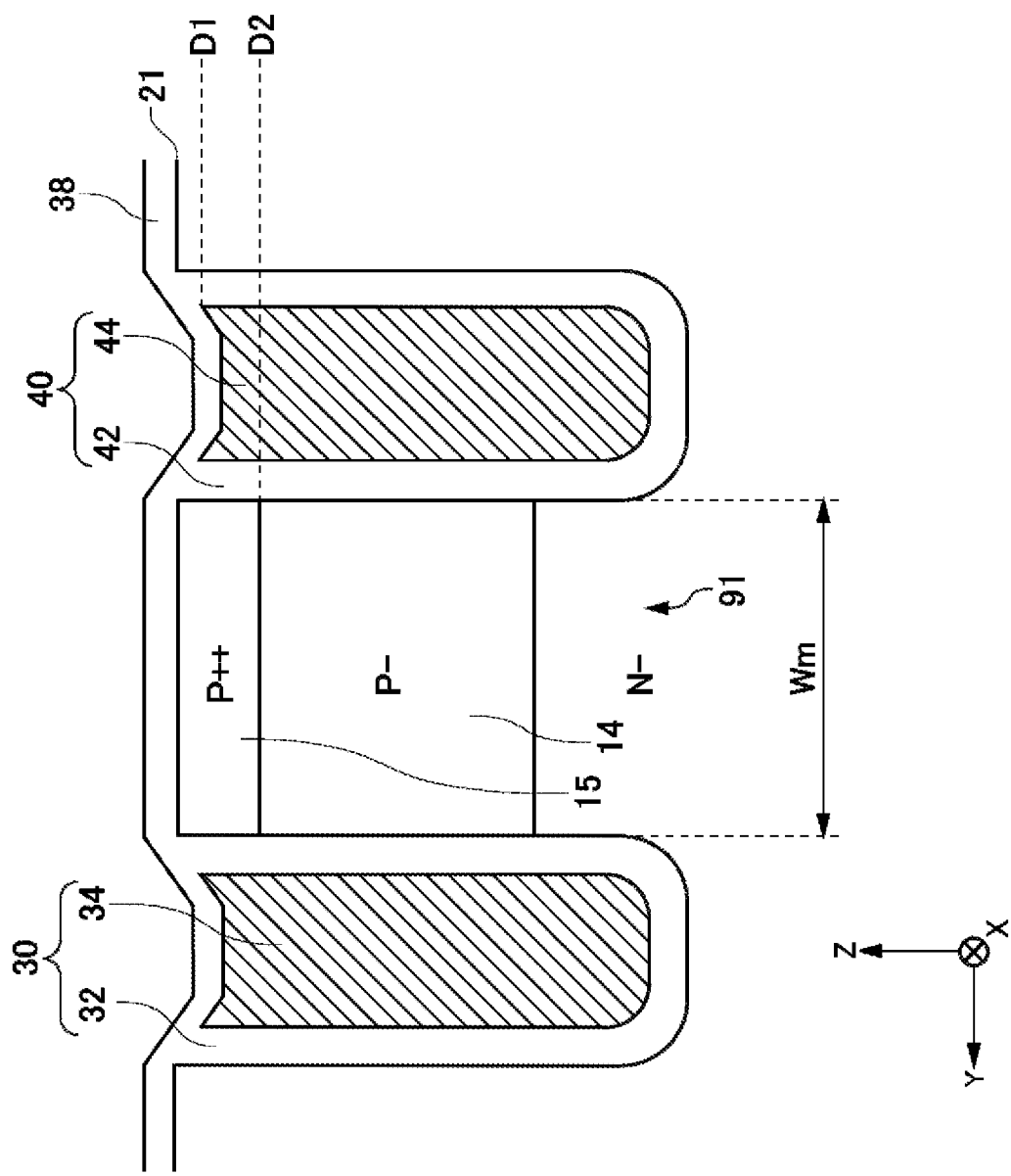
FIG. 10C shows an exemplary enlarged view of a mesa portion 91 according to the fifth embodiment example.

FIG. 10C shows an exemplary enlarged view of a mesa portion 91 according to the fifth embodiment example. FIG. 10C shows the mesa portion 91 between a dummy trench portion 30 and a gate trench portion 40.

The mesa width Wm of the mesa portion 91 of the semiconductor device 100 of this example is less than or equal to 100 nm. Therefore, it is possible to conductivity modulate the base region 14 due to the IE effect, and the IV characteristics of the semiconductor device 100 are improved.

Figure 11:
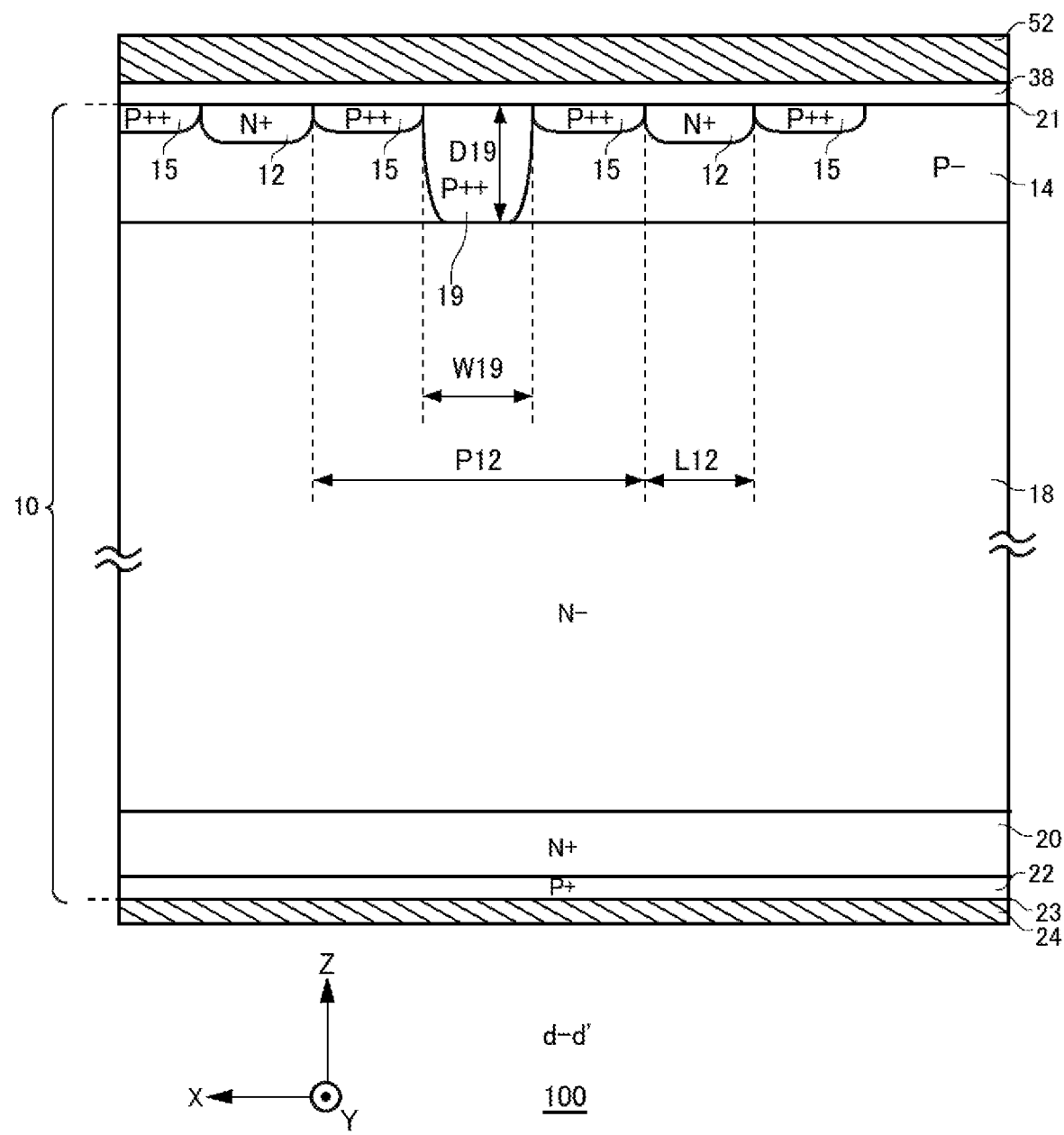
FIG. 11 shows an exemplary configuration of a semiconductor device 100 according to a sixth embodiment example.

FIG. 11 shows an exemplary configuration of a semiconductor device 100 according to a sixth embodiment example. FIG. 11 shows an example of the d-d' cross section in FIG. 4A.

The semiconductor device 100 of this example differs from the semiconductor device 100 according to the second embodiment example by not being provided with the accumulation region 16.

The carrier path layer 19 extends in the depth direction of the semiconductor substrate 10 from the top surface 21 of the mesa portion 91. The carrier path layer 19 of this example is provided extending to a depth that is the same as the depth of the base region 14. The carrier path layer 19 of this example is provided extending from the dummy trench portion 30 to the gate trench portion 40 in the mesa portion 91.

The depth D19 of the bottom end of the carrier path layer 19, using the top surface 21 of the semiconductor substrate 10 as a reference, is preferably greater than or equal to the interval between the carrier path layer 19 and the emitter region 12 at the top surface 21 of the mesa portion 91. In this example, the interval between the carrier path layer 19 and the emitter region 12 is shown by (P12−W19)/2.

The carrier path layer 19 of this example connects the contact region 15 and the drift region 18, within the base region 14. Accordingly, the carrier path layer 19 can draw the holes in the base region 14 out into the contact region 15. Due to this, the carrier path layer 19 can restrict latch-up of the semiconductor device 100.

Figure 12:
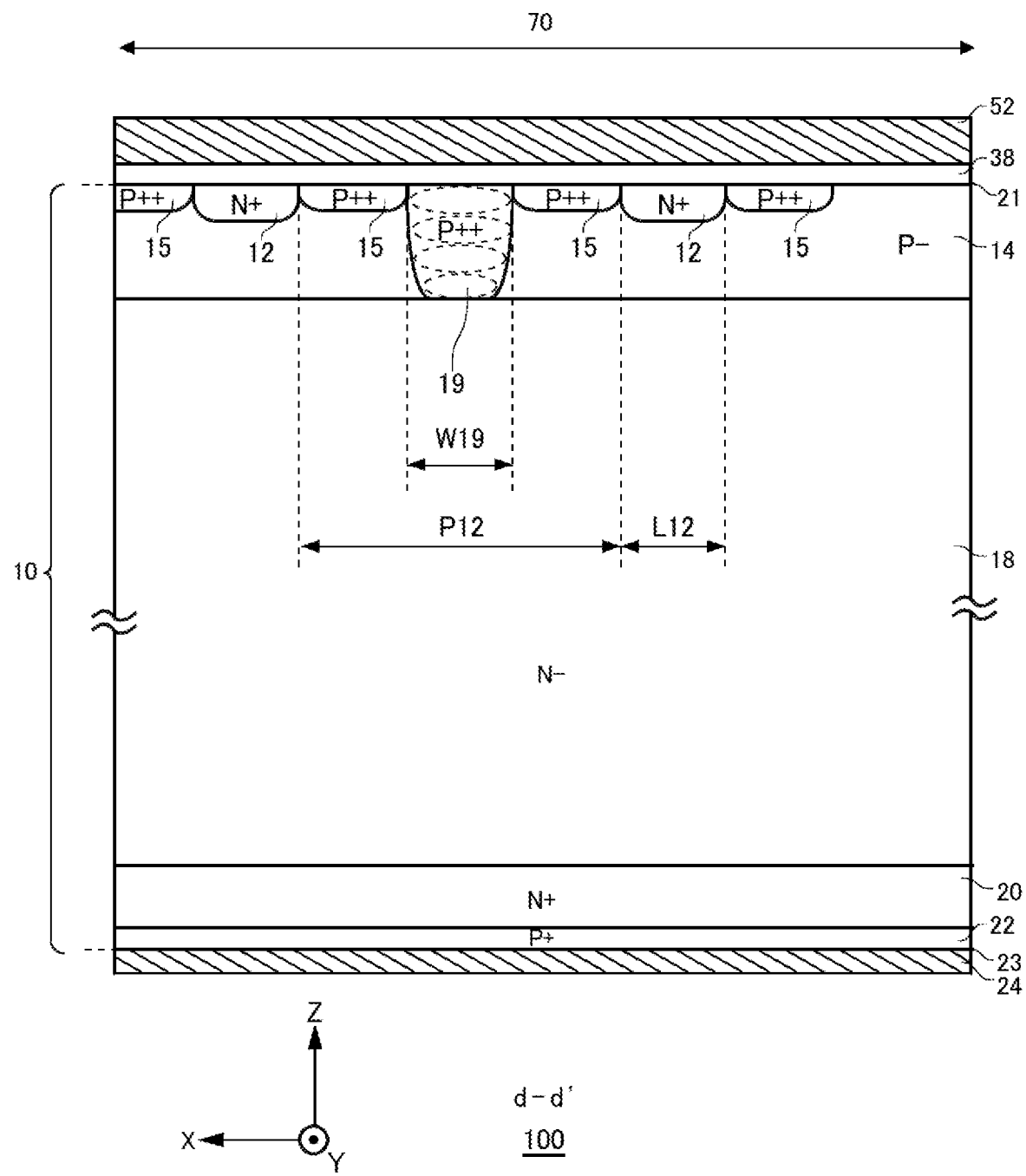
FIG. 12 shows an exemplary configuration of a semiconductor device 100 according to a seventh embodiment example.

FIG. 12 shows an exemplary configuration of a semiconductor device 100 according to a seventh embodiment example. FIG. 12 shows an example of the d-d' cross section in FIG. 4A.

The semiconductor device 100 of this example differs from the semiconductor device 100 according to the third embodiment example by not being provided with the accumulation region 16. In the semiconductor device 100 of this example, the carrier path layer 19 is formed by multistage ion injection. In this example, the carrier path layer 19 is formed using four-stage ion injection, but the number of ion injections is not limited to this example.

Figure 13:
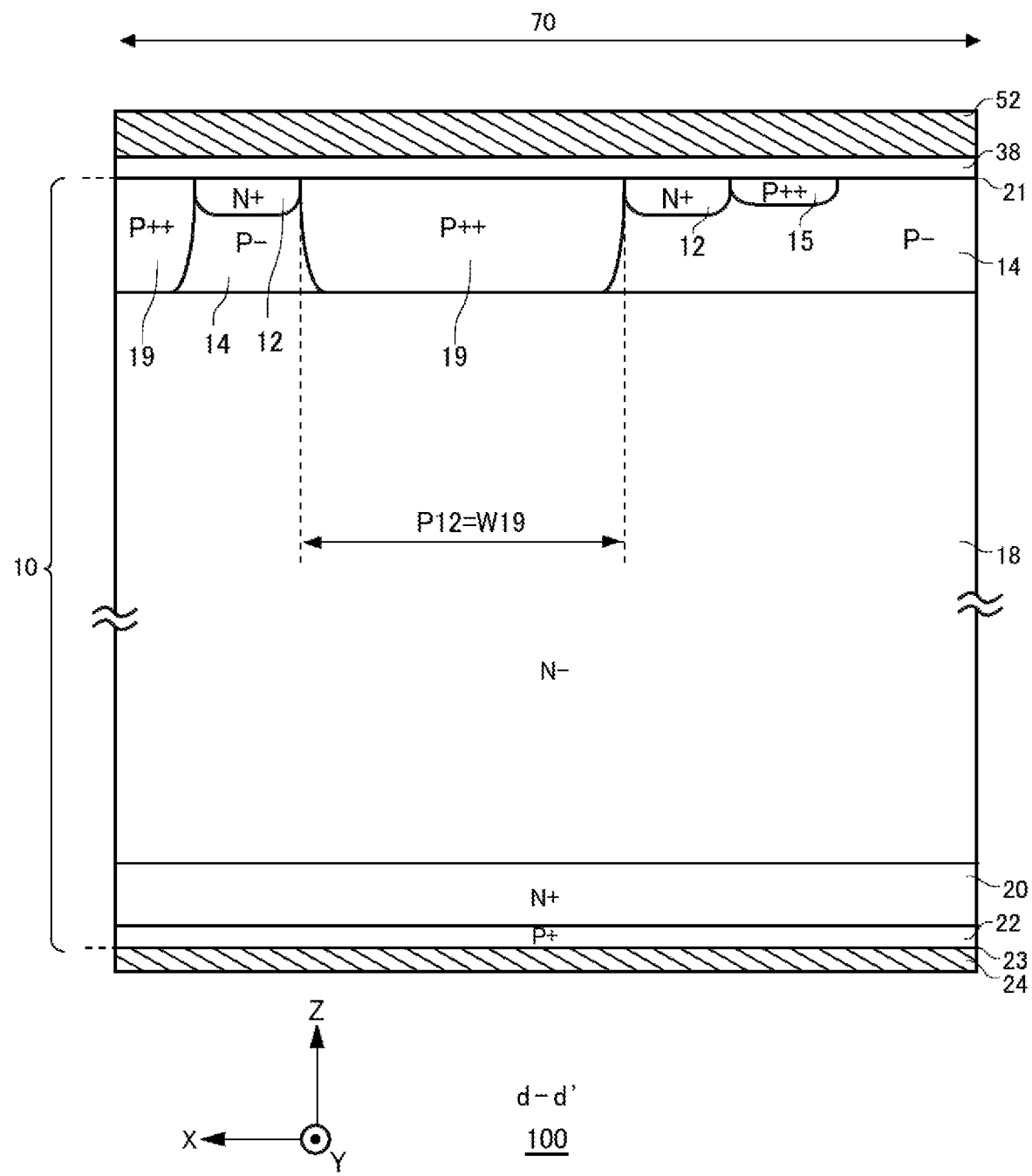
FIG. 13 shows an exemplary configuration of a semiconductor device 100 according to an eighth embodiment example.

FIG. 13 shows an exemplary configuration of a semiconductor device 100 according to an eighth embodiment example. FIG. 13 shows an example of the d-d' cross section in FIG. 4A.

The semiconductor device 100 of this example differs from the semiconductor device 100 according to the fourth embodiment example by not being provided with the accumulation region 16.

The width W19 of the carrier path layer 19 occupies the entire region between the adjacent emitter regions 12. In other words, the width W19 is equal to the interval P12 between the adjacent emitter regions 12. In this case, the occupancy percentage of the carrier path layer 19 is 100%. The semiconductor device 100 of this example can further reduce the ratio of the electron current occupying the collector current Ic, by increasing the occupancy percentage of the carrier path layer 19. Due to this, latch-up is restricted.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LISTS OF REFERENCE NUMERALS

10: semiconductor substrate, 11: well region, 12: emitter region, 14: base region, 15: contact region, 16: accumulation region, 18: drift region, 19: carrier path layer, 20: buffer region, 21: top surface, 22: collector region, 23: bottom surface, 24: collector electrode, 25: connecting section, 30: dummy trench portion, 31: extending portion, 32: dummy insulating film, 33: connecting portion, 34: dummy conducting portion, 38: interlayer dielectric film, 40: gate trench portion, 41: extending portion, 42: gate insulating film, 43: connecting portion, 44: gate conducting portion, 48: gate runner, 49: contact hole, 56: contact hole, 70: transistor portion, 91: mesa portion, 100: semiconductor device, 500: semiconductor device, 515: contact region, 512: emitter region

What is claimed is:

1. A semiconductor device comprising:
   a drift region having a first conductivity type provided on a semiconductor substrate;
   a plurality of trench portions provided above the drift region, on a top surface side of the semiconductor substrate;
   a base region having a second conductivity type provided in a mesa portion sandwiched between the plurality of trench portions, in the semiconductor substrate;
   an emitter region having the first conductivity type provided above the base region, on a top surface of the mesa portion; and
   a contact region having the second conductivity type and a higher doping concentration than the base region, provided adjacent to the emitter region on the top surface of the mesa portion, wherein
   a mesa width of the mesa portion is less than or equal to 100 nm,
   a bottom end of the contact region is shallower than a bottom end of the emitter region,
   the contact region directly contacts the emitter region and at least one of the trench portions,
   a plurality of the emitter regions arranged on the top surface of the mesa portion; and
   a carrier path layer having a second conductivity type and a higher doping conductivity type and a higher doping concentration than the base region, extending in a depth direction of the semiconductor substrate,
   wherein the carrier path layer is in direct contact with an emitter electrode and in direct contact with the drift region.

2. The semiconductor device according to claim 1, wherein
   the plurality of trench portions include gate conducting portions, and
   the bottom end of the contact region is deeper than top ends of the gate conducting portions.

3. The semiconductor device according to claim 1, wherein
   the carrier path layer extends between adjacent emitter regions.

4. The semiconductor device according to claim 3, wherein
   the carrier path layer has the same doping concentration as the contact region.

5. The semiconductor device according to claim 3, wherein
   a depth of a bottom end of the carrier path layer is greater than or equal to an interval between the carrier path layer and the emitter region at the top surface of the mesa portion.

6. The semiconductor device according to claim 3, wherein
   the carrier path layer is provided at a position including at least a center between adjacent emitter regions, at the top surface of the mesa portion.

7. The semiconductor device according to claim 3, wherein
   the carrier path layer occupies a region that is greater than or equal to 25% and less than or equal to 75% of a region between adjacent emitter regions, at the top surface of the mesa portion.

8. The semiconductor device according to claim 1, wherein
the bottom end of the contact region directly contacts the base region.

9. A semiconductor device comprising:
a drift region having a first conductivity type provided on a semiconductor substrate;
a plurality of trench portions provided above the drift region, on a top surface side of the semiconductor substrate;
a base region having a second conductivity type provided in a mesa portion sandwiched between the plurality of trench portions, in the semiconductor substrate;
a plurality of emitter regions having the first conductivity type arranged on a top surface of the mesa portion; and
a carrier path layer having a second conductivity type and a higher doping concentration than the base region, in direct contact with an emitter electrode and in direct contact with the drift region, extending in a depth direction of the semiconductor substrate, wherein
a mesa width of the mesa portion is less than or equal to 100 nm, and
the carrier path layer occupies the entire region between adjacent emitter regions among the plurality of emitter regions, at the top surface of the mesa portion.

10. The semiconductor device according to claim 9, comprising
a contact region having the second conductivity type and a higher doping concentration than the base region, provided adjacent to the emitter region on the top surface of the mesa portion, wherein
the contact region directly contacts the emitter region and at least one of the trench portions.

11. The semiconductor device according to claim 9, comprising
a contact region having the second conductivity type and a higher doping concentration than the base region, provided adjacent to the emitter region on the top surface of the mesa portion, wherein
the bottom end of the contact region directly contacts the base region.

* * * * *